(12) United States Patent
Nishimura

(10) Patent No.: US 11,282,946 B2
(45) Date of Patent: Mar. 22, 2022

(54) SEMICONDUCTOR DEVICE

(71) Applicant: FUJI ELECTRIC CO., LTD., Kawasaki (JP)

(72) Inventor: Takeyoshi Nishimura, Nagano (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/218,896

(22) Filed: Mar. 31, 2021

(65) Prior Publication Data

US 2021/0375855 A1 Dec. 2, 2021

(30) Foreign Application Priority Data

May 29, 2020 (JP) .............................. JP2020-095045
Nov. 30, 2020 (JP) .............................. JP2020-198773

(51) Int. Cl.
| | | |
|---|---|---|
| *H01L 29/739* | (2006.01) | |
| *H01L 29/66* | (2006.01) | |
| *H01L 27/06* | (2006.01) | |
| *H01L 29/808* | (2006.01) | |

(Continued)

(52) U.S. Cl.
CPC .... *H01L 29/66909* (2013.01); *H01L 27/0617* (2013.01); *H01L 27/098* (2013.01); *H01L 29/7803* (2013.01); *H01L 29/7813* (2013.01); *H01L 29/8083* (2013.01)

(58) Field of Classification Search
CPC ............. H01L 29/7813; H01L 29/8083; H01L 29/66909; H01L 29/7803; H01L 29/0696; H01L 29/1066; H01L 29/66734; H01L 29/7802; H01L 29/7811; H01L 27/098; H01L 29/66712; H01L 27/088;
(Continued)

(56) References Cited

U.S. PATENT DOCUMENTS

| | | | |
|---|---|---|---|
| 6,429,481 B1 | 8/2002 | Mo et al. | |
| 10,879,385 B2 * | 12/2020 | Gu | ...................... H01L 29/1095 |
| 2007/0252178 A1 | 11/2007 | Onose | |

(Continued)

FOREIGN PATENT DOCUMENTS

| | | |
|---|---|---|
| JP | H1041402 A | 2/1998 |
| JP | 2007294716 A | 11/2007 |

(Continued)

*Primary Examiner* — Shouxiang Hu
(74) *Attorney, Agent, or Firm* — Rabin & Berdo, P.C.

(57) ABSTRACT

A semiconductor device includes an enhancement mode MOSFET and a junction FET. The MOSFET has a first semiconductor substrate of a first conductivity type, a first first-semiconductor-layer of the first conductivity type, first second-semiconductor-regions of a second conductivity type, first first-semiconductor-regions of the first conductivity type, first gate insulating films, first gate electrodes, a first first-electrode, and a first second-electrode. The FET has a second semiconductor substrate of the first conductivity type, a second first-semiconductor-layer of the first conductivity type, second first-semiconductor-regions of the first conductivity type, a second second-semiconductor-layer of the second conductivity type, second gate electrodes, a second first-electrode, and a second second-electrode. The first second-electrode and the second second-electrode are connected electrically.

24 Claims, 21 Drawing Sheets

(51) Int. Cl.
*H01L 29/78* (2006.01)
*H01L 27/098* (2006.01)

(58) Field of Classification Search
CPC ............. H01L 27/0883; H01L 29/4236; H01L 29/7397; H01L 29/7832; H01L 27/0617
See application file for complete search history.

(56) References Cited

U.S. PATENT DOCUMENTS

| | | | |
|---|---|---|---|
| 2014/0117416 A1* | 5/2014 | Zhang | H01L 21/8232 257/262 |
| 2015/0162777 A1* | 6/2015 | Lui | H02J 7/0072 320/107 |
| 2017/0366004 A1 | 12/2017 | Nishikawa et al. | |
| 2020/0091135 A1 | 3/2020 | Nishimura et al. | |

FOREIGN PATENT DOCUMENTS

| | | | |
|---|---|---|---|
| JP | 2011223028 A | 11/2011 |
| JP | 2017224769 A | 12/2017 |
| JP | 2020047660 A | 3/2020 |

\* cited by examiner

SEMICONDUCTOR DEVICE

CROSS REFERENCE TO RELATED APPLICATIONS

This application is based upon and claims the benefit of priority of the prior Japanese Patent Application Nos. 2020-095045, filed on May 29, 2020 and 2020-198773, filed on Nov. 30, 2020, the entire contents of which are incorporated herein by reference.

BACKGROUND OF THE INVENTION

1. Field of the Invention

Embodiments of the invention relate to a semiconductor device.

2. Description of the Related Art

Conventionally, an automobile is equipped with a 12V, 24V, or 48V battery and a metal oxide semiconductor field effect transistor (MOSFET) is used as a switching device element that switches current to a load. During assembly of the automobile or replacement of the battery, when an error in the wiring of a power source connected to the MOSFET occurs, large current passes in a forward direction through a parasitic diode in the MOSFET and damage may occur to not only the MOSFET, but to a control circuit (system) to which the MOSFET is connected. As a countermeasure, various types of reverse connection preventing circuits that prevent current from flowing when a circuit is connected in reverse have been proposed.

FIG. 34 depicts a first example of a reverse connection preventing circuit of a conventional semiconductor device. FIG. 34 depicts a circuit that connects an n-channel MOSFET 101 and a p-channel MOSFET 102 in series. By connecting the n-channel MOSFET 101 and the p-channel MOSFET 102 in series, parasitic diodes in both MOSFETs are connected to each other bidirectionally. In an instance in which proper circuit connection is performed, when the n-channel MOSFET 101 turns ON, forward current flows through the parasitic diode of the p-channel MOSFET 102. In an instance in which wiring of the battery is erroneously connected in reverse, even when the n-channel MOSFET 101 turns ON and reverse current is applied to the parasitic diode of the p-channel MOSFET 102, the current is blocked by the parasitic diode, whereby destruction of the control circuit, etc. is prevented.

FIG. 35 depicts a second example of the reverse connection preventing circuit of the conventional semiconductor device. FIG. 35 depicts a circuit with a built-in reverse connection preventing diode. In the circuit, the n-channel MOSFET 101 and a reverse connection preventing diode 103 are disposed serially, whereby the reverse connection preventing diode 103 is connected bidirectionally with the parasitic diode in the MOSFET and even when the battery is erroneously connected in reverse, the reverse connection preventing diode blocks the current, whereby destruction of the control circuit, etc. is prevented.

Further, a method of preventing destruction by controlling the forward current of a parasitic diode by building-in a control circuit has been proposed. Further, a method of preventing destruction by forming a junction with the parasitic diode of the MOSFET as a Schottky junction, whereby even when the battery is connected in reverse, the current is blocked by the Schottky barrier has been proposed. Further, a method of preventing destruction of the control circuit, etc. by a structure connecting source electrodes of the MOSFETs or a structure connecting drain electrodes of the MOSFETs, whereby the parasitic diode is bidirectional and even when the battery is connected in reverse, the flow of the current is blocked by the parasitic diode has been proposed.

Further, a semiconductor device having a structure integrating a junction FET and a DMOS FET connected serially and for which overcurrent that flows when gates of the high-voltage DMOS FET are ON may be set to an arbitrary design value is commonly known (for example, refer to Japanese Laid-Open Patent Publication No. 10-41402).

SUMMARY OF THE INVENTION

According to an embodiment of the invention, a semiconductor device includes an enhancement mode MOSFET (metal-oxide-semiconductor field effect transistor) having: a first semiconductor substrate of a first conductivity type, having a first surface and a second surface opposite to each other; a first first-semiconductor-layer of the first conductivity type, provided on the first surface of the first semiconductor substrate and having an impurity concentration lower than an impurity concentration of the first semiconductor substrate; the first semiconductor substrate and the first first-semiconductor-layer having a first active region and a first termination region surrounding the first active region, the first active region having: a first second-semiconductor-layer of a second conductivity type, selectively provided in the first first-semiconductor-layer at a surface thereof; a plurality of first first-semiconductor-regions of the first conductivity type, provided in the first second-semiconductor-layer at a surface thereof; a plurality of trenches each in contact with a respective one of the first first-semiconductor-regions, and penetrating through the first second-semiconductor-layer so that a bottom of each of the trenches is positioned further from the first surface in a depth direction than the first second-semiconductor-layer; a plurality of first gate-insulating-films each provided in a respective one of the trenches; a plurality of first gate electrodes each provided in a respective one of the trenches via a respective one of the first gate-insulating-films; a first interlayer-insulating-film covering upper surfaces of the first first-semiconductor-regions and the first gate electrodes, and being free of direct contact with the first second-semiconductor-layer; a first first-electrode provided on upper surfaces of the first first-semiconductor-regions and the first interlayer-insulating-film; and a first second-electrode provided in an entire area of the second surface of the first semiconductor substrate; a junction FET having: a second semiconductor substrate of the first conductivity type, having a third surface and a fourth surface opposite to each other; a second first-semiconductor-layer of the first conductivity type, provided on the third surface of the second semiconductor substrate and having an impurity concentration lower than an impurity concentration of the second semiconductor substrate; the second semiconductor substrate and the second first-semiconductor-layer having a second active region and a second termination region surrounding the second active region, the second active region having: a plurality of second first-semiconductor-regions of the first conductivity type, each selectively provided in the second first-semiconductor-layer at a surface thereof; a plurality of second second-semiconductor-layers of the second conductivity type, each selectively provided in the second first-semiconductor-layer at the surface thereof; a second interlayer insulating film covering upper surfaces of the second first-semiconductor-layer and the second second-semiconductor-layers, and being free of direct contact with at least a portion of an upper surface of each of the second first-semiconductor-regions; and a second first-electrode provided on upper surfaces of the second interlayer insulating film and the second first-semiconductor-regions; the second termination region having a second gate electrode electrically connected to the second second-semiconductor-layers; and a second second-electrode provided in an entire area of the fourth surface of the second semiconductor substrate. The first second-electrode is electrically connected to the second second-electrode.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
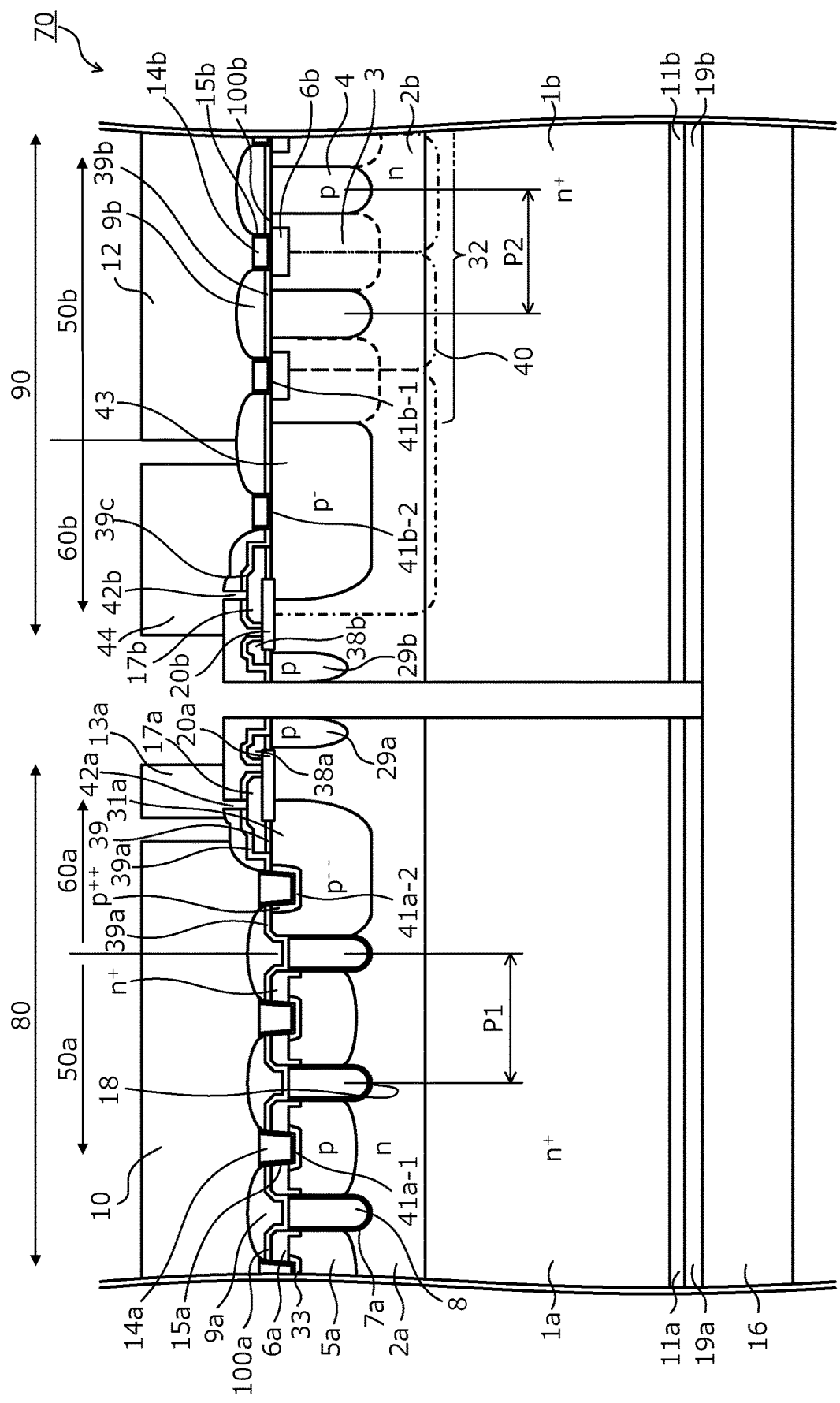
FIG. 1 is a cross-sectional view depicting a structure of a semiconductor device according to a first embodiment.

First problems associated with the conventional techniques are discussed. ON resistance of the p-channel MOSFET 102 is about three times the ON resistance of the n-channel MOSFET 101 and therefore, in the first example of the reverse connection preventing circuit of the conventional semiconductor device, a problem arises in that during normal connection, the n-channel MOSFET 101 turns ON and the ON resistance of the p-channel MOSFET 102 when forward current passes through the parasitic diode of the p-channel MOSFET 102 increases. To prevent the ON resistance from increasing, the area of the chip has to be increased, in which case, problems of increased cost and limitations on package size arise.

Further, the ON resistance increases by the amount of forward voltage Vf of the reverse connection preventing diode 103 and therefore, in the second example of the reverse connection preventing circuit of the conventional semiconductor device as well, the problem of increased ON resistance arises. Further, even with a countermeasure method using a control circuit, the ON resistance increases by an amount attributed to the control circuit and the cost further increases due to processes for forming the control circuit, increases in the chip area for the control circuit, and the like. Further, there is a product in which the reverse connection preventing diode 103 is replaced with a Schottky barrier diode or to prevent reverse connection to the MOSFET, a p-type region having a low impurity concentration is provided and a contact is set as a p-type Schottky junction. However, in an instance of Schottky, problems arise in that variation easily occurs and leak current is large with Schottky.

Further, even with a structure that connects the source electrodes of the MOSFETs or a structure that connects the drain electrodes of the MOSFETs, MOSFETs are connected serially and therefore, a problem arises in that the ON resistance increases. Prior art literature (Japanese Laid-Open Patent Publication No. 10-41402) of the structure integrating the junction FET and the DMOS FET connected serially does not consider an instance of reverse connection of the battery and is a structure incapable of limiting current in an instance of reverse connection.

Embodiments of a semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described.

FIG. 1 is a cross-sectional view depicting a structure of a semiconductor device according to a first embodiment. As depicted in FIG. 1, a semiconductor device 70 is configured by an enhancement mode MOSFET 80 and a junction FET (junction-FET) 90.

The enhancement mode MOSFET 80 is a MOSFET having metal oxide semiconductor (MOS) gates in a semiconductor base (silicon base: semiconductor chip) containing silicon (Si), at a front surface of the semiconductor base (surface of an n-type drift layer 2a described hereinafter). The enhancement mode MOSFET 80 includes an active region (first active region) 50a and an edge termination region (first termination region) 60a that surrounds a periphery of the active region 50a. The active region 50a is a region through which current passes in an ON state. The edge termination region 60a includes a breakdown voltage sustaining region that mitigates electric field of a drift region at a semiconductor-base front side of the drift region. A border between the active region 50a and the edge termination region 60a is a center of a trench 18 that of multiple trenches 18, has only one sidewall in contact with an $n^+$-type source region (second first-semiconductor-region of the first conductivity type) 6a of multiple $n^+$-type source regions 6a.

In FIG. 1, two unit cells (functional units of a device element) of the active region 50a are depicted while other unit cells adjacent to these are not depicted. Here, a unit cell is an interval P1 from a center of one of the trenches 18 to a center of another of the trenches 18 adjacent thereto. The interval P1 is assumed to be a cell pitch of the enhancement mode MOSFET 80.

An $n^+$-type semiconductor substrate (first semiconductor substrate of a first conductivity type) 1a is a silicon single crystal substrate doped with, for example, arsenic (As) or phosphorous (P). On a front surface of the $n^+$-type semiconductor substrate 1a, the n-type drift layer (first first-semiconductor-layer of the first conductivity type) 2a is provided. The n-type drift layer 2a has an impurity concentration lower than an impurity concentration of an $n^+$-type semiconductor substrate 1 and is a low-concentration n-type layer doped with, for example, phosphorus. Hereinafter, the $n^+$-type semiconductor substrate 1a and the n-type drift layer 2a combined are regarded as the semiconductor base. Between the $n^+$-type semiconductor substrate 1a and the n-type drift layer 2a, an n-type buffer layer (not depicted) having an impurity concentration lower than the impurity concentration of the n-type drift layer 2a may be disposed. The n-type buffer layer is a low-concentration n-type layer doped with, for example, phosphorus. In the semiconductor base, at the front surface thereof, a MOS gate structure (device element structure) is formed. Further, on a back surface of the semiconductor base, a back electrode (first second-electrode) 11a constituting a drain electrode is provided. The back electrode 11a is bonded to a frame electrode 16, for example, a lead frame, via solder 19a.

Further, p-type base regions (first second-semiconductor-layer of a second conductivity type) 5a are provided in a surface layer of the n-type drift layer 2a and the $n^+$-type source regions (first first-semiconductor-regions of the first conductivity type) 6a are selectively provided in respective surface layers of the p-type base regions 5a. In the respective surface layers of the p-type base regions 5a, $p^{++}$-type contact regions 33 in contact with the $n^+$-type source regions 6a may be selectively provided.

In the semiconductor base, at a first main surface thereof (a surface 100a of the n-type drift layer 2a), a trench structure is formed. The trench structure is configured by the trenches 18, gate insulating films 7a, and gate electrodes 8. In particular, the trenches 18 that penetrate through the p-type base regions 5a and the $n^+$-type source regions 6a from the surface 100a of the n-type drift layer 2a and reach the n-type drift layer 2a are provided. The trenches 18 are provided deeper than are the p-type base regions 5a. A depth direction is a direction from the surface 100a of the n-type drift layer 2a to the $n^+$-type semiconductor substrate 1a. Along inner walls of the trenches 18, the gate insulating films 7a are provided and the gate electrodes (first gate electrodes) 8 are provided respectively on the gate insulating films 7a respectively in the trenches 18. The gate electrodes 8 are insulated from the p-type base regions 5a by the gate insulating films 7a.

An interlayer insulating film (first interlayer-insulating-film) 9a is provided so as to cover the gate electrodes 8 embedded in the trenches 18 in the semiconductor base at the first main surface thereof. Between the interlayer insulating film 9a and the $n^+$-type source regions 6a and between the interlayer insulating film 9a and the gate electrodes 8 provided in the semiconductor base at the first main surface thereof, an oxide film (first insulating film) 39a is provided. The oxide film 39a is, for example, a high temperature oxide (HTO), a tetraethyl orthosilicate (TEOS) film, or a thermal oxide film. The oxide film 39a is provided so that the interlayer insulating film 9a doped with an impurity of a high concentration is not in direct contact with the semiconductor base. As a result, the impurity doped in the interlayer insulating film 9a at a high concentration is suppressed from diffusing to the semiconductor base, and variation of characteristics such as the gate threshold voltage (Vth) and reduced film quality of the gate insulating films 7a may be prevented.

In the interlayer insulating film 9a and the oxide film 39a, trenches (grooves) that penetrate through the $n^+$-type source regions 6a and are in contact with the $p^{++}$-type contact regions 33 respectively are provided. These trenches are contact holes 41a-1. A source electrode (first first-electrode) 10 is electrically connected to the $n^+$-type source regions 6a and the p-type base regions 5a by the contact holes 41a-1 formed in the interlayer insulating film 9a and the oxide film 39a. The contact holes 41a-1 may be provided so as to penetrate through the $n^+$-type source regions 6a and be in contact with the $p^{++}$-type contact regions 33. Each sidewall of each of the contact holes 41a-1 is in contact with one of the $n^+$-type source regions 6a and a bottom of each of the contact holes 41a-1 has thereunder one of the $p^{++}$-type contact regions 33. The source electrode 10 is electrically insulated from the gate electrodes 8 by the interlayer insulating film 9a and the oxide film 39a. Between the source electrode 10 and the interlayer insulating film 9a and between the source electrode 10 and the oxide film 39a, for example, a barrier metal 15a that prevents diffusion of metal atoms from the source electrode 10 to the gate electrodes 8 may be provided. The barrier metal 15a is a titanium film (Ti), a titanium nitride film (TiN), or a stacked film of these (for example, Ti/TiN, etc.).

Further, in the contact holes 41a-1 provided in the interlayer insulating film 9a and the oxide film 39a, contact plugs 14a may be embedded respectively, via the barrier metal 15a. The contact plugs 14a, for example, are metal films having tungsten (W), which is highly embeddable, as a material. The contact holes 41a-1 are trenches (grooves) that penetrate through the $n^+$-type source regions 6a and that are in contact with the $p^{++}$-type contact regions 33. A bottom and portions of each sidewall of each of the contact holes 41a-1 are in contact with one of the $p^{++}$-type contact regions 33, whereby holes of the p-type base regions 5a may be pulled out to the source electrode 10 at positions deeper than the $n^+$-type source regions 6a during avalanche operation. As a result, parasitic bipolar operation may be suppressed. A protective film (not depicted) such as a passivation film containing, for example, a polyimide is selectively provided on the source electrode 10.

In the edge termination region 60a that sustains the breakdown voltage, a $p^{---}$-type RESURF region (first third-semiconductor-layer) 31a is provided in the n-type drift layer 2a, at a surface thereof. The $p^{---}$-type RESURF region 31a is in contact with an outermost sidewall of the trench 18 that is at the border between the active region 50a and the edge termination region 60a, the outermost sidewall being closest to the edge termination region 60a, of the sidewalls of said trench 18. In an outer periphery of the edge termination region 60a, a p-type channel stopper (first fourth-semiconductor-layer) 29a is provided in the n-type drift layer 2a at a surface of the n-type drift layer 2a, separate from the $p^{---}$-type RESURF region 31a. As a result, the n-type drift layer 2a is provided between the $p^{---}$-type RESURF region 31a and the p-type channel stopper 29a.

The $p^{---}$-type RESURF region 31a has an impurity concentration lower than an impurity concentration of the p-type base regions 5a. The p-type channel stopper 29a may have an impurity concentration higher than the impurity concentration of the $p^{---}$-type RESURF region 31a and equal to the impurity concentration of the p-type base regions 5a. On an upper surface of the $p^{---}$-type RESURF region 31a and an upper surface of the p-type channel stopper 29a, an oxide film 39 and the oxide film 39a are provided. A field oxide film 20a is provided from an upper surface of the n-type drift layer 2a, spanning to a portion of the upper surface of the $p^{---}$-type RESURF region 31a. The field oxide film 20a is in contact with the oxide film 39.

A gate wiring 17a is provided on and straddling an upper surface of the field oxide film 20a and an upper surface of the oxide film 39 provided on an outer peripheral portion of the upper surface of the $p^{---}$-type RESURF region 31a in the edge termination region 60a. A field plate 38a is provided on and straddling the upper surface of the field oxide film 20a and the upper surface of the oxide film 39 provided on the upper surface of the p-type channel stopper 29a. The gate wiring 17a and the field plate 38a are provided by a polycrystalline silicon film and are separated by the upper surface of the field oxide film 20a. A surface and side surfaces of the gate wiring 17a and a surface and side surfaces of the field plate 38a are covered by the oxide film 39a. An upper portion of the gate wiring 17a and an upper portion of the field plate 38a are covered by the same interlayer insulating film 9a, via the oxide film 39a covering each. In the interlayer insulating film 9a and the oxide film 39a covering the upper portion of the gate wiring 17a, a contact hole 42a is provided, exposing the gate wiring 17a.

In the contact hole 42a, a gate runner 13a is provided so as to be embedded therein. The gate runner 13a is connected electrically to a gate electrode pad (not depicted) and the gate electrodes 8. As a result, the gate wiring 17a is connected electrically to the gate electrodes 8. One of the $p^{++}$-type contact regions 33 is provided in the $p^{---}$-type RESURF region 31a at the surface of the $p^{---}$-type RESURF region 31a, near the active region 50a. A trench (groove) that penetrates through the interlayer insulating film 9a and the oxide film 39a is provided in the $p^{---}$-type RESURF region 31a at the surface of the $p^{---}$-type RESURF region 31a near the active region 50a, a bottom and a portion of each sidewall of the trench being covered by the $p^{++}$-type contact region 33. This trench is a contact hole 41a-2. In the contact hole 41a-2, one of the contact plugs 14a may be embedded via the barrier metal 15a. The contact plug 14a, for example, is a metal film containing tungsten (W), which has high embeddability.

The source electrode 10 extends onto the interlayer insulating film 9a on top of the gate wiring 17a in the edge termination region 60a, from the active region 50a, and is insulated from the gate runner 13a. The source electrode is connected electrically to the $p^{---}$-type RESURF region 31a by the contact hole 41a-2. The $p^{---}$-type RESURF region 31a, the gate wiring 17a, the field oxide film 20a, the p-type channel stopper 29a, the field plate 38a, and the gate runner 13a may be provided having a ring-shape in a plan view thereof. In the edge termination region 60a, a voltage withstanding structure such as a p-type guard ring may be provided instead of the $p^{---}$-type RESURF region 31a. Furthermore, the p-type channel stopper 29a may be set as an n-type channel stopper.

The junction FET 90 includes an active region 50b and an edge termination region 60b that surrounds a periphery of the active region 50b. A border between the active region 50b and the edge termination region 60b is an end of a drain electrode 12. In FIG. 1, only two unit cells (functional units of a device element) of the active region 50*b* are depicted while other unit cells adjacent to these are not depicted. Here, a unit cell is an interval P2 between respective centers of p-type column regions 4 that are adjacent to one another and sandwich an n⁺-type column region 3 therebetween.

The semiconductor device 70 is configured by the junction FET 90 and the enhancement mode MOSFET 80, and the drain electrode of the junction FET 90 is connected to the drain electrode of the enhancement mode MOSFET 80. Here, for consistency with an equivalent circuit diagram depicted in FIG. 2 described hereinafter, a source electrode on a front side of the junction FET 90 (a first main side of the semiconductor base described hereinafter) is the drain electrode 12 of the semiconductor device 70, and the drain electrode on a back side of the junction FET 90 (a back side of the semiconductor base described hereinafter) is a source electrode of the semiconductor device 70 (a back electrode 11*b*). Therefore, in the description hereinafter, the source electrode on the front side of the junction FET 90 is referred to as the drain electrode 12 and the drain electrode provided on the back surface of the junction FET 90 is referred to as the back electrode 11*b*.

An n⁺-type semiconductor substrate (second semiconductor substrate of the first conductivity type) 1*b* of the junction FET 90 is a silicon single crystal substrate doped with, for example, arsenic (As) or phosphorus (P). On the n⁺-type semiconductor substrate 1*b*, an n-type drift layer (second first-semiconductor-layer of the first conductivity type) 2*b* is provided. The n-type drift layer 2*b* has an impurity concentration lower than the impurity concentration of the n⁺-type semiconductor substrate 1*b* and is a low-concentration n-type layer doped with, for example, phosphorus. Hereinafter, the n⁺-type semiconductor substrate 1*b* and the n-type drift layer 2*b* combined are regarded as the semiconductor base. Here, a surface of the n-type drift layer 2*b* of the semiconductor base is regarded as a surface 100*b*. On the back surface of the semiconductor base, the back electrode (second second-electrode) 11*b* that is the source electrode of the semiconductor device 70 is provided. The back electrode 11*b* is bonded to the frame electrode 16 via solder 19*b*. The frame electrode 16 is, for example, a lead frame, etc. The frame electrode 16 electrically connects the back electrode 11*a* of the enhancement mode MOSFET 80 and the back electrode 11*b* of the junction FET 90.

In the active region 50*b* of the junction FET 90, a parallel pn region 32 may be provided in the n-type drift layer 2*b* as a super junction (SJ) structure. For example, in a case of large current of at least 100A, the parallel pn region 32 may be provided. Further, the parallel pn region 32 may be provided in the edge termination region 60*b* as well.

In the parallel pn region (first parallel pn structure) 32, n-type column regions 3 and the p-type column regions 4 are disposed to repeatedly alternate with one another in a direction parallel to the surface 100*b* of the n-type drift layer 2*b*. The p-type column regions 4 are provided from the surface 100*b* of the n-type drift layer 2*b*, toward the n⁺-type semiconductor substrate 1*b*, so as not to reach the n⁺-type semiconductor substrate 1*b*. Portions of the n-type drift layer 2*b* between adjacent p-type column regions 4 of the p-type column regions 4 are the n-type column regions 3 (dotted line portion in FIG. 1 and not depicted in drawings thereafter). Therefore, an impurity concentration of the n-type column regions 3 is lower than the impurity concentration of the n⁺-type semiconductor substrate 1*b*. The n-type column regions 3 and the p-type column regions 4 of the parallel pn region 32 are disposed having a stripe shape in a plan view thereof. In the n-type column regions 3 provided in the n-type drift layer 2*b*, n⁺-type source regions (second first-semiconductor-regions) 6*b* are provided at surfaces of the n-type column regions 3.

In the parallel pn region 32, an impurity amount (impurity amount=impurity concentration×volume) contained in the p-type column regions 4 and an impurity amount of the n-type column regions 3 are set to be equal, whereby in an OFF state of the junction FET 90 (state in which negative potential is applied to a gate electrode 44 described hereinafter), from pn junctions between the p-type column regions 4 and the n-type column regions 3, a depletion layer 40 extends (spreads) in the p-type column regions 4 and the n-type column regions 3, in a horizontal direction (direction in which the p-type column regions 4 and the n-type column regions 3 repeatedly alternate with one another) and in the depth direction (direction from the surface 100*b* of the n-type drift layer 2*b* to the n⁺-type semiconductor substrate 1*b*).

Spreading of the depletion layer 40 changes according to cell pitch. The cell pitch is assumed to be the interval P2 between the centers of the p-type column regions 4 that are adjacent to one another and sandwich one of the n-type column regions 3. As a result, the narrower is the cell pitch (the interval P2), the more easily the depletion layer 40 spreads in the horizontal direction, enabling high breakdown voltage to be achieved. Therefore, even when the impurity concentration of the n-type column regions 3 is increased, it is possible to reduce the ON resistance without the breakdown voltage decreasing. A compensation region occurs near the pn junctions between the n-type column regions 3 and the p-type column regions 4. The compensation region indicates a region in which, virtually, the n-type impurity concentration decreases and the resistance increases by the p-type impurity diffusing from the p-type column regions 4 into the n-type column regions 3. By increasing the impurity concentration of the n-type column regions 3, spreading of the compensation region having high resistance may be suppressed and increases in drift resistance may be suppressed.

On the first main surface of the semiconductor base (the surface 100*b* of the n-type drift layer 2*b*), an oxide film (second insulating film) 39*b* is provided. On an upper surface of the oxide film 39*b*, an interlayer insulating film (second interlayer insulating film) 9*b* is provided. In the oxide film 39*b* and the interlayer insulating film 9*b*, contact holes 41*b*-1 are provided, exposing surfaces of the n⁺-type source regions 6*b*. The contact holes 41*b*-1 may assume a shape providing trenches (grooves) in the n⁺-type source regions 6*b*.

On an upper surface of the interlayer insulating film 9*b* of the first main side of the semiconductor base, the drain electrode (second first-electrode) 12 is provided. The drain electrode (second first-electrode) 12 is connected to the n⁺-type source regions 6*b* by the contact holes 41*b*-1 provided in the oxide film 39*b* and the interlayer insulating film 9*b*. Further, between the drain electrode 12 and the oxide film 39*b* and between the drain electrode 12 and the interlayer insulating film 9*b*, a barrier metal 15*b* may be provided. The drain electrode 12 is electrically insulated from the p-type column regions 4 by the oxide film 39*b* and the interlayer insulating film 9. The barrier metal 15*b* is a titanium film (Ti), a titanium nitride film (TiN), or a stacked film of these (for example, Ti/TiN, etc.).

Further, in the contact holes 41*b*-1 formed in the oxide film 39*b* and the interlayer insulating film 9*b*, contact plugs 14*b* may be embedded via the barrier metal 15*b*. The contact plugs 14*b* are metal films having tungsten (W), which is highly embeddable, as a material. The drain electrode 12 is connected electrically to the n$^+$-type source regions 6b via the contact plugs 14b and the barrier metal 15b. On the drain electrode 12, a protective film (not depicted) such as a passivation film containing, for example, a polyimide, is provided. In the protective film, openings are selectively provided.

In the edge termination region 60b, a p$^-$-type well region (second third-semiconductor-layer) 43 is provided in the semiconductor base, at the first main surface thereof. The p$^-$-type well region 43 is in contact with the n-type column regions 3. Furthermore, by the p$^-$-type well region 43, in an outer peripheral side of the edge termination region 60b, a p-type channel stopper (second fourth-semiconductor-layer) 29b separate from the p$^-$-type well region 43 is provided. Between the p$^-$-type well region 43 and the p-type channel stopper 29b, the n-type drift layer 2b is provided. The p$^-$-type well region 43 may have an impurity concentration lower than the impurity concentration of the p-type column regions 4 and equal to the concentration of the p$^{--}$-type RESURF region 31a. Further, the p-type channel stopper 29b may have an impurity concentration higher than the impurity concentration of the p$^-$-type well region 43 and equal to the impurity concentration of the p-type column regions 4.

Further, in the edge termination region 60b, on the n-type drift layer 2b and the p$^-$-type well region 43 of the first main side of the semiconductor base, a field oxide film 20b is provided. The field oxide film 20b is connected to the oxide film 39b. An end of the field oxide film 20b facing the active region 50b is provided in the p$^-$-type well region 43. On the oxide film 39b and the field oxide film 20b toward the active region 50b, a polycrystalline silicon film that forms a gate wiring 17b is provided. The gate wiring 17b is connected electrically to the p-type column regions (second second-semiconductor-layer) 4. On the gate wiring 17b, an oxide film 39c is provided so as to cover the gate wiring 17b.

On the field oxide film 20b and the oxide film 39b in the outer periphery of the edge termination region 60b, a polycrystalline silicon film that forms a field plate 38b is provided. On the field plate 38b, the oxide film 39c is provided so as to cover the field plate 38b. The gate wiring 17b and the field plate 38b are separate from each other on the field oxide film 20b. On the gate wiring 17b and the field plate 38b covered by the oxide film 39c, the interlayer insulating film 9b is provided.

In the interlayer insulating film 9b and the oxide film 39c on the gate wiring 17b, a contact hole 42b is provided, exposing the gate wiring 17b. Further, in the interlayer insulating film 9b and the oxide film 39b on the p$^-$-type well region 43, a contact hole 41b-2 are provided, exposing the p$^-$-type well region 43. The contact hole 41b-2 may assume a shape providing a trench (groove) in the p$^-$-type well region 43.

On an upper surface of the interlayer insulating film 9b of the edge termination region 60b, a gate electrode (second gate electrode) 44 is provided. The gate electrode 44 is separate from the drain electrode 12 on the interlayer insulating film 9b that is in the edge termination region 60b, near the active region 50b. The drain electrode 12 and the gate electrode 44 are metal films containing, for example, aluminum or an alloy having aluminum as a main constituent. The gate electrode 44 is connected electrically to the p$^-$-type well region 43 by the contact hole 41b-2 provided in the interlayer insulating film 9b and the oxide film 39b. Further, the gate electrode 44 is connected electrically to the gate wiring 17b by the contact hole 42b provided in the interlayer insulating film 9b and the oxide film 39c.

In the contact hole 41b-2 provided in the interlayer insulating film 9b and the oxide film 39c, one of the contact plugs 14b may be embedded via the barrier metal 15b. The barrier metal 15b is a titanium film (Ti), a titanium nitride film (TiN), or a stacked film of these (for example, Ti/TiN, etc.). The contact plugs 14b, for example, is a metal film containing tungsten (W), which has high embeddability. The gate electrode 44 is connected electrically to the p$^-$-type well region 43 via the contact plug 14b and the barrier metal 15b.

A gate electrode pad (not depicted) is provided so as to be in contact with the gate electrode 44 in a plan view thereof. The field oxide film 20b, the p$^-$-type well region 43, the p-type channel stopper 29b, the gate wiring 17b, the field plate 38b, and the gate electrode 44 are provided having a ring-shape in a plan view thereof. The p$^-$-type well region 43 is connected electrically to the p-type column regions 4. As a result, the gate electrode 44 is connected electrically to the gate wiring 17b, the p$^-$-type well region 43, and the p-type column regions 4.

As a result, when the junction FET 90 is in an OFF state in which negative potential is applied to the gate electrode 44, from the pn junctions between the p-type column regions 4 and the n-type column regions 3, the depletion layer 40 may spread in the p-type column regions 4 and the n-type column regions 3, in the horizontal direction (direction in which the p-type column regions 4 and the n-type column regions 3 repeatedly alternate with one another). The depletion layer 40 further spreads in the horizontal direction from pn junctions between the n-type column regions 3, the n-type drift layer 2b of the edge termination region 60b and the p$^-$-type well region 43. The gate electrode 44 is connected electrically to the gate electrode pad (not depicted) provided on the first main side of the semiconductor base.

To further enhance reliability, the enhancement mode MOSFET 80, for example, may include a high-function portion such as a current sensing portion, a temperature sensing portion, and an overvoltage protecting portion that detect current, voltage, and protect against overcurrent. The high-function portion is provided in the enhancement mode MOSFET 80. The junction FET 90 is provided to block or suppress current and therefore, the high-function portion may be omitted.

Figure 2:
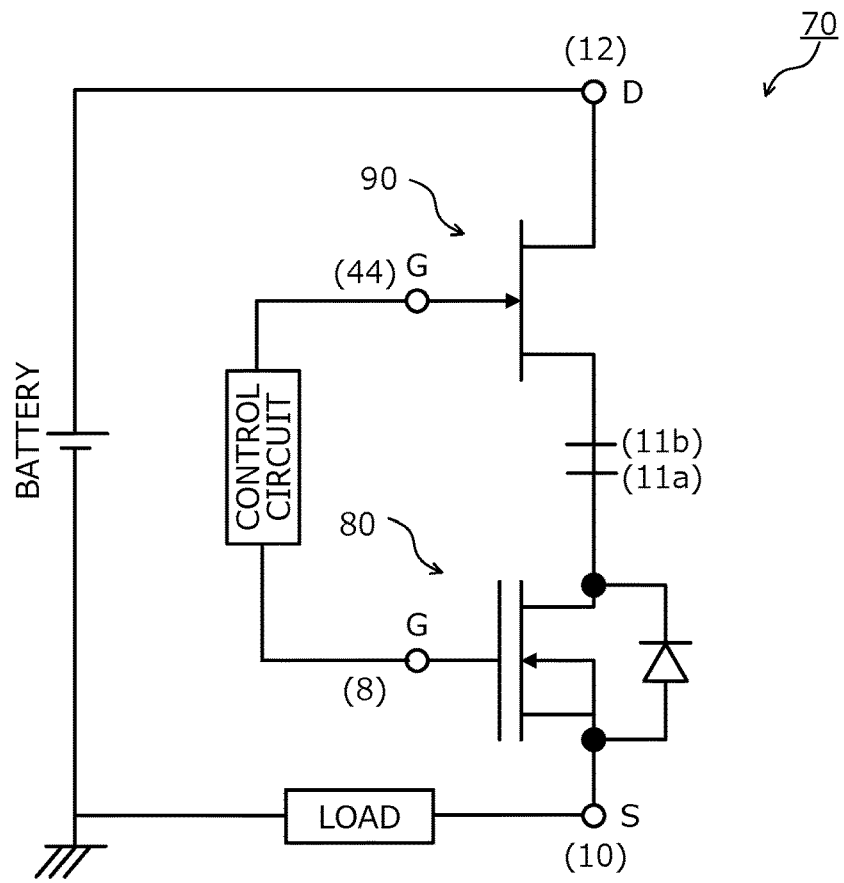
FIG. 2 is an equivalent circuit diagram of the semiconductor device according to the first embodiment.

As depicted in FIG. 1, the back electrode 11a of the enhancement mode MOSFET 80 is connected electrically with the back electrode 11b of the junction FET 90 by the frame electrode 16. FIG. 2 is an equivalent circuit diagram of the semiconductor device according to the first embodiment. In FIG. 2, the gate electrodes 8, the source electrode 10, the gate electrode 44, the drain electrode 12, and the back electrodes 11a, 11b of the semiconductor device 70 according to the first embodiment are indicated by reference numerals in parentheses.

In the equivalent circuit depicted in FIG. 2, an instance is depicted in which a battery is connected correctly (connected in sequence) to the semiconductor device 70 according to the first embodiment. When the battery is connected in sequence to the semiconductor device 70, positive potential is applied to the drain electrode 12 of the junction FET 90. In the junction FET 90, current flowing from the battery flows from the drain electrode 12 (drain D in FIG. 2) to the back electrode 11b. The enhancement mode MOSFET 80 is connected in the forward direction and a parasitic diode of the enhancement mode MOSFET 80 is connected in the reverse direction. In this instance, in a state in which a voltage signal that is from the control circuit and turns ON the enhancement mode MOSFET 80 is not applied to the gate electrodes 8 (OFF state), current does not flow from the junction FET 90 to the enhancement mode MOSFET 80. When a voltage signal that is from the control circuit and turns ON the enhancement mode MOSFET 80 is applied to the gate electrodes 8, current from the battery and passing through the junction FET 90 flows to the enhancement mode MOSFET 80. Current flowing from the back electrode 11a of the enhancement mode MOSFET 80 to the source electrode 10 (source S in FIG. 2) is supplied to a load.

On the other hand, an instance in which a positive electrode and a negative electrode of the battery are erroneously connected to the semiconductor device 70 according to the first embodiment (reversely connected) is described. When the battery is connected to the semiconductor device 70, positive potential is applied to the source electrode 10 (source S in FIG. 2) of the enhancement mode MOSFET 80. The enhancement mode MOSFET 80 is connected in the reverse direction and the parasitic diode of the enhancement mode MOSFET 80 is connected in the forward direction. Therefore, it is assumed that even in a state in which a voltage signal that is from the control circuit and turns ON the enhancement mode MOSFET 80 is not applied to the gate electrodes 8 (OFF state), current flowing from the battery flows from the source electrode 10 (source S in FIG. 2) of the enhancement mode MOSFET 80, through the parasitic diode, to the junction FET 90. In this instance, a voltage signal that is from the control circuit and turns OFF the junction FET 90 is transmitted to the gate electrode 44 of the junction FET 90. In particular, negative potential is applied to the gate electrode 44 of the junction FET 90. As a result, as depicted in FIG. 1, the depletion layer 40 from the pn junctions between the n-type column regions 3 and the p-type column regions 4 and the pn junctions between the n-type drift layer 2b, the n-type column regions 3, and the p⁻-type well region 43 spreads, whereby a path along which current in the n-type column regions 3 flows becomes closed. Therefore, a state is entered in which the junction FET 90 does not pass current (OFF state) and therefore, even when the parasitic diode of the enhancement mode MOSFET 80 is in a conducting state, the semiconductor device 70 according to the first embodiment may block current.

Whether the battery is connected in reverse to the semiconductor device 70 according to the first embodiment may be detected by the control circuit. For example, when the battery is reversely connected to the semiconductor device 70, potential of the source electrode 10 of the enhancement mode MOSFET 80 becomes higher than with normal connection (connection in sequence) and becomes substantially equal to the potential of the positive electrode of the battery. Source potential of the enhancement mode MOSFET 80 is input to the control circuit via a potential detecting electrode pad (not depicted). As a result, the control circuit detects the source potential of the enhancement mode MOSFET 80 via the potential detecting electrode pad, compares a detected value with a preset value and, thereby, may judge whether the battery is connected in reverse to the semiconductor device 70 according to the first embodiment.

Further, not only in an instance of reverse connection of the semiconductor device 70 according to the first embodiment but also in an instance of normal connection (connection in sequence), when the control circuit detects an abnormality of the semiconductor device 70, the control unit transmits a signal that turns OFF the enhancement mode MOSFET 80 to the gate electrodes 8. For example, in an instance in which the current sensing portion provided in the enhancement mode MOSFET 80 detects that current flowing in the semiconductor device 70 exceeds a specified value, or the temperature detected by the temperature sensing portion provided in the enhancement mode MOSFET 80 exceeds a specified value, the control circuit transmits the signal that turns OFF the enhancement mode MOSFET 80 to the gate electrodes 8. As a result, the enhancement mode MOSFET 80 is turned OFF and therefore, even in a state in which current from the battery flows to the junction FET 90 (conducting state), the semiconductor device 70 may block the current. In this manner, in an instance in which an abnormality occurs in the semiconductor device 70 used as a semiconductor switch, the control circuit turns OFF the enhancement mode MOSFET 80 and prevents erroneous operation of the semiconductor device 70.

In this manner, in the first embodiment, the semiconductor device 70 connects the drain electrode (the back electrode 11a) of the enhancement mode MOSFET 80 and the drain electrode (the back electrode 11b) of the junction FET 90. The semiconductor device 70 uses the source electrode 10 of the enhancement mode MOSFET 80 as the source electrode 10 of the semiconductor device 70 and uses the source electrode of the junction FET 90 as the drain electrode 12 of the semiconductor device 70. As a result, when the battery is connected normally (connection in sequence), the parasitic diode in the enhancement mode MOSFET 80 blocks large current from the battery and therefore, the junction FET 90 does not block the current.

On the other hand, when the battery is connected in reverse, while large current that flows from the battery to the parasitic diode of the enhancement mode MOSFET 80 cannot be blocked, a predetermined voltage is applied to the gate electrode 44 of the junction FET 90, whereby the large current from the battery may be blocked. Further, the junction FET 90 that has a resistance lower than the resistance of the conventional semiconductor device that uses the p-channel MOSFET 102 depicted in FIG. 34 and lower than the resistance of the conventional semiconductor device that uses the diode 103 depicted in FIG. 35 is used and therefore, an increase of the ON resistance when the battery is connected properly (connection in sequence) may be suppressed to be low. Furthermore, in the enhancement mode MOSFET 80 and the junction FET 90, no Schottky connection is used and therefore, increases in leak current may be suppressed.

Further, like the first embodiment, the semiconductor device 70 to which the separate enhancement mode MOSFET 80 and junction FET 90 are connected may have different impurity concentrations in the n-type drift layers 2a, 2b of the enhancement mode MOSFET 80 and the junction FET 90, respectively. For example, the impurity concentration of the n-type drift layer 2b of the junction FET 90 is set to be lower than the impurity concentration of the n-type drift layer 2a of the enhancement mode MOSFET 80, whereby spreading of the depletion layer 40 from the pn junctions between the n-type column regions 3 and the p-type column regions 4 of the junction FET 90 and the pn junctions between the n-type drift layer 2b, the n-type column regions 3, and the p⁻-type well region 43 is facilitated. As a result, in an instance in which the battery is connected in reverse, even when the gate voltage applied to the gate electrode 44 of the junction FET 90 is low, current may be blocked, and it becomes possible to arbitrarily block higher voltage. Further, in an instance in which the battery is connected properly (connection in sequence), the ON resistance may also be set lower than in the conventional semiconductor device that uses the p-channel MOSFET 102 depicted in FIG. 34 and in the conventional semiconductor device that uses the diode 103 depicted in FIG. 35. For example, the impurity concentration of the n-type drift layer 2b of the junction FET 90 suffices to be in a range from $2\times10^{16}/cm^3$ to $1\times10^{17}/cm^3$. Further, the breakdown voltage necessary in an instance of reverse connection is about a few 10V and therefore, reducing the impurity concentration of the n-type drift layer 2b of the junction FET 90 or increasing the thickness of the n-type drift layer 2b is not necessary.

Further, the depletion layer 40 spreads and the depletion layer 40 adjacent thereto is easily connected and therefore, the cell pitch (the interval P2) of the junction FET 90 suffices to be narrower than the cell pitch (the interval P1) of the enhancement mode MOSFET 80. For example, the cell pitch of the enhancement mode MOSFET 80 is about 2.0 μm and the cell pitch of the junction FET 90 is about 1.6 μm. The cell pitch of the junction FET 90 (the interval P2) may be equal to the cell pitch of the enhancement mode MOSFET 80 (the interval P1).

Further, the junction FET 90 has in the active region 50b, the parallel pn region 32 (SJ structure) in which the n-type column regions 3 and the p-type column regions 4 are disposed to repeatedly alternate with one another. As a result, blocking of large current is facilitated and the impurity concentration of the n-type drift layer 2b may be further increased, whereby increases in the ON resistance may be further suppressed.

Figure 3:
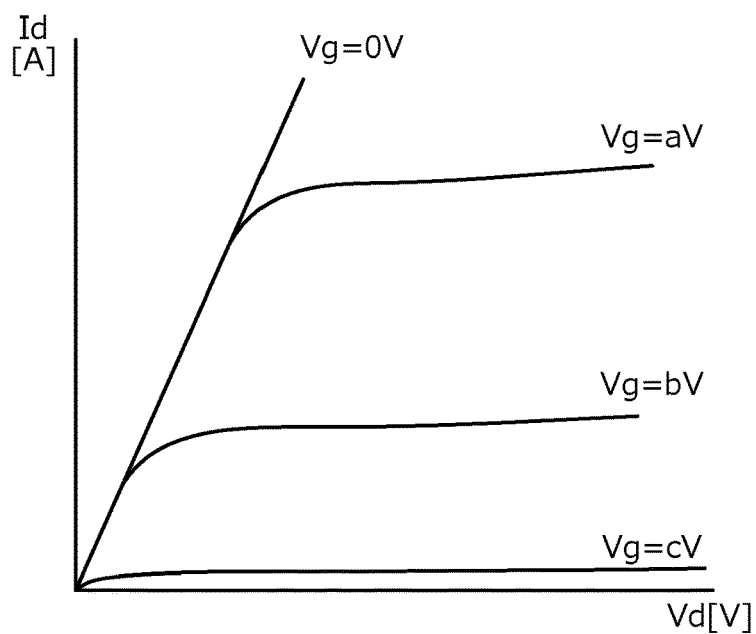
FIG. 3 is graph depicting output characteristics when a battery is connected in reverse to the semiconductor device according to the first embodiment.

FIG. 3 is graph depicting output characteristics when the battery is connected in reverse to the semiconductor device 70 according to the first embodiment. In FIG. 3, a horizontal axis indicates drain voltage Vd in units of [V]. A vertical axis indicates drain current Id in units of [A]. In an instance in which the battery is connected in reverse, the source S depicted in FIG. 2 is the drain depicted in FIG. 3. As output characteristics, instances are depicted in which when gate voltage applied to the gate electrode 44 is gate voltage Vg=0V, and gate voltage Vg that is lower than 0V and satisfies c<b<a is applied. As depicted in FIG. 3, the semiconductor device 70 according to the first embodiment may suppress the gate voltage Vg applied to the gate electrode 44 when the battery is connected in reverse and thereby, may block large current flowing from the battery.

Next, a method of manufacturing the semiconductor device 70 according to the first embodiment is described. The semiconductor device 70 according to the first embodiment is manufactured by manufacturing the enhancement mode MOSFET 80 and the junction FET 90 separately and mounting the enhancement mode MOSFET 80 and the junction FET 90 on the frame electrode 16 by, for example, a bonding material such as the solder 19a, 19b.

Figure 4:
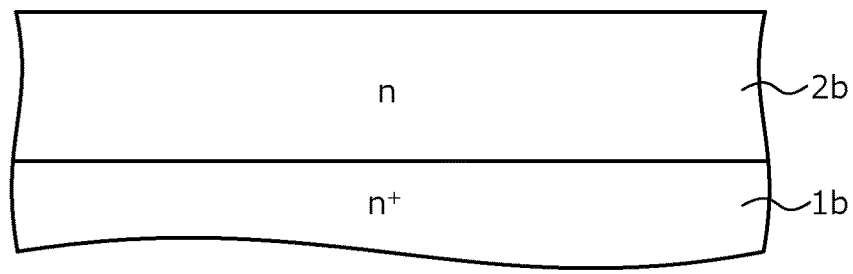
FIG. 4 is a cross-sectional view of a state of the semiconductor device according to the first embodiment during manufacture by a first method of manufacturing.

A method of manufacturing the junction FET 90 is described. FIGS. 4, 5, 6, 7, 8, 9, 10, and 11 are cross-sectional views of states of the semiconductor device according to the first embodiment during manufacture by a first method of manufacturing. First, the $n^+$-type semiconductor substrate 1b forming an $n^+$-type drain layer is prepared. Next, on the surface of the $n^+$-type semiconductor substrate 1b, the n-type drift layer 2b having an impurity concentration lower than the impurity concentration of the $n^+$-type semiconductor substrate 1b is epitaxially grown. The state up to here is depicted in FIG. 4. Here, while an instance in which the $n^+$-type semiconductor substrate 1b contains silicon (Si) is depicted, the $n^+$-type semiconductor substrate 1b may contain silicon carbide (SiC).

Next, on the surface of the n-type drift layer 2b, an ion implantation mask 23 having predetermined openings is formed by a photolithographic technique, using, for example, a photoresist. The openings are provided at positions where the p-type column regions 4 are to be provided.

Figure 5:
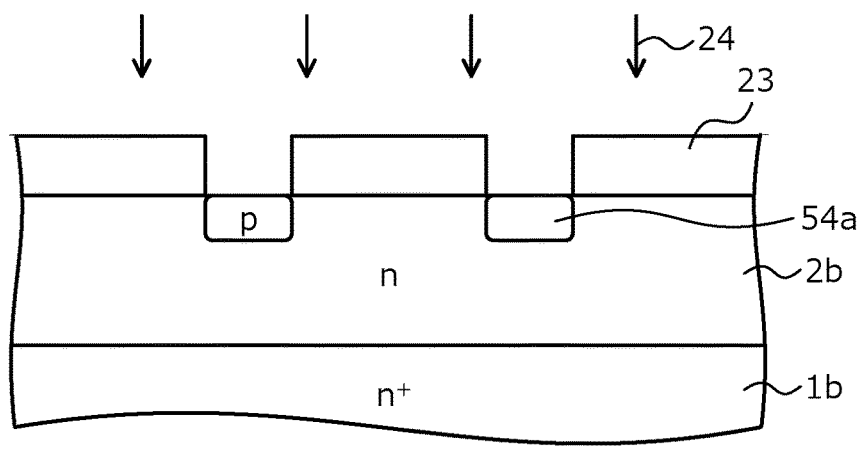
FIG. 5 is a cross-sectional view of a state of the semiconductor device according to the first embodiment during manufacture by the first method of manufacturing.

An ion implantation 24 of a p-type impurity such as, for example, boron (B) is performed using the ion implantation mask 23 as a mask. By this ion implantation, first p-type column implanted regions 54a implanted with a p-type impurity are formed in the n-type drift layer 2b, at the surface of the n-type drift layer 2b. The state up to here is depicted in FIG. 5. Next, the ion implantation mask 23 is removed.

Figure 6:
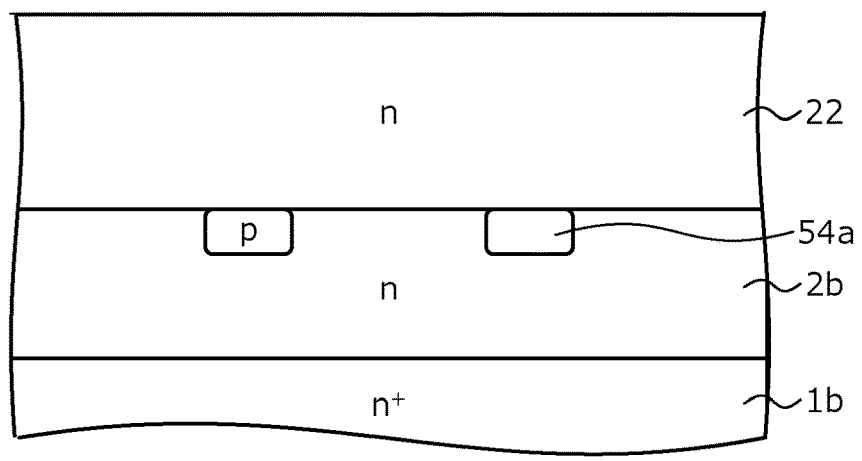
FIG. 6 is a cross-sectional view of a state of the semiconductor device according to the first embodiment during manufacture by the first method of manufacturing.
Figure 7:
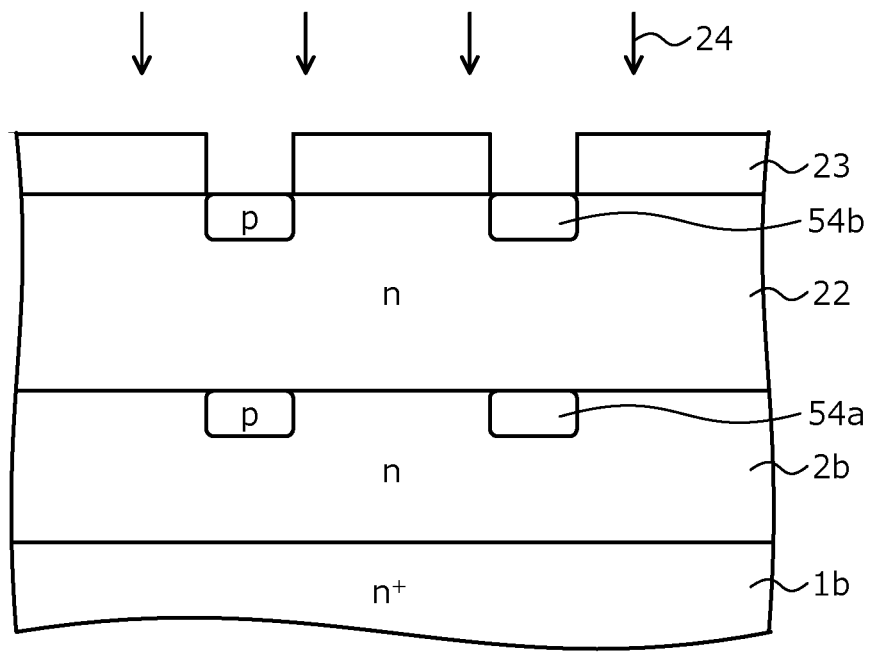
FIG. 7 is a cross-sectional view of a state of the semiconductor device according to the first embodiment during manufacture by the first method of manufacturing.

Next, on the surface of the n-type drift layer 2b, an n-type epitaxial layer 22 having an impurity concentration higher than the impurity concentration of the n-type drift layer 2b is epitaxially grown. The state up to here is depicted in FIG. 6. Next, on the surface of the n-type epitaxial layer 22, the ion implantation mask 23 having openings is formed by a photolithographic technique, using, for example, a photoresist. The openings are formed at positions where the p-type column regions 4 are to be formed. The ion implantation 24 of a p-type impurity such as, for example, boron (B) is performed using the ion implantation mask 23 as a mask. By the ion implantation 24, second p-type column implanted regions 54b implanted with a p-type impurity are formed in the n-type epitaxial layer 22 at the surface of the n-type epitaxial layer 22. The state up to here is depicted in FIG. 7. Next, the ion implantation mask 23 is removed.

Figure 8:
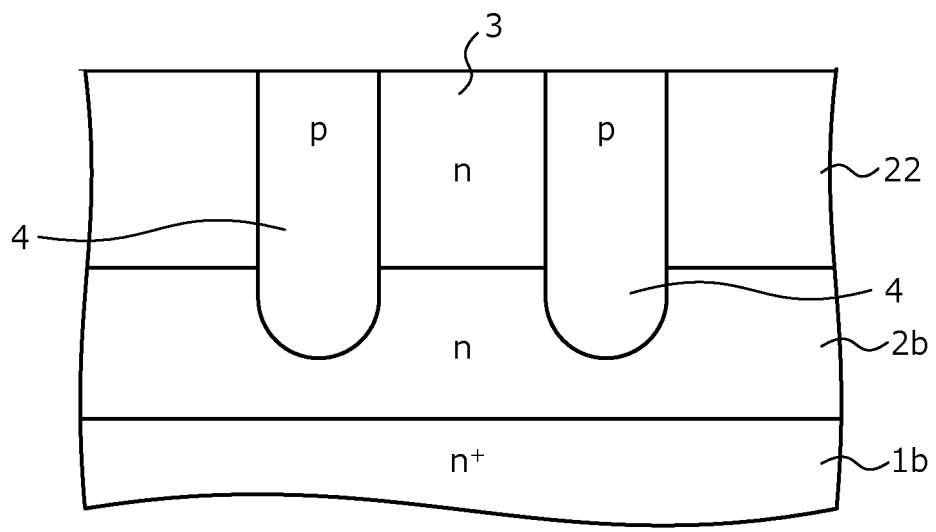
FIG. 8 is a cross-sectional view of a state of the semiconductor device according to the first embodiment during manufacture by the first method of manufacturing.

The epitaxial growth for forming the n-type epitaxial layer 22 and the ion implantation 24 for forming the second p-type column implanted regions 54b are repeated a predetermined number of times. Next, a heat treatment for diffusing the first p-type column implanted regions 54a and the second p-type column implanted regions 54b formed by the ion implantations 24 is performed. By this heat treatment, implanted impurities are diffused and the impurity diffused regions are connected vertically, whereby the p-type column regions 4 are formed. Portions of the n-type drift layer 2b and the n-type epitaxial layer 22 between adjacent p-type column regions 4 of the p-type column regions 4 are the n-type column regions 3. The state up to here is depicted in FIG. 8. Hereinafter, the n-type drift layer 2b is assumed to include the n-type epitaxial layer 22 formed on the upper surface of the n-type drift layer 2b. The surface of the n-type drift layer 2b is assumed to be the surface 100b. Further, a state in which the n-type drift layer 2b is formed on the $n^+$-type semiconductor substrate 1b is assumed to be the semiconductor base.

Next, in the edge termination region 60b, on the surface 100b of the n-type drift layer 2b near the active region 50b, an ion implantation mask (not depicted) having an opening is formed by a photolithographic technique, using, for example, a photoresist. The opening is formed at a position where the $p^-$-type well region 43 is to be formed. An ion implantation of a p-type impurity such as, for example, boron (B) is performed using the ion implantation mask as a mask. By this ion implantation, a p-type impurity for forming the $p^-$-type well region 43 in the n-type drift layer 2b at the surface thereof in the edge termination region 60b, near active region is implanted. After implantation of the p-type impurity for forming the $p^-$-type well region 43, the ion implantation mask is removed, and a heat treatment for diffusing the p-type impurity is performed. By this heat treatment, the implanted p-type impurity is diffused, thereby forming the $p^-$-type well region 43.

Furthermore, on the surface 100b of the n-type drift layer 2b in an outer periphery of the edge termination region 60b, an ion implantation mask (not depicted) having an opening is formed by a photolithographic technique, using, for example, a photoresist. The opening is formed at a position where the p-type channel stopper 29b is to be provided. An ion implantation of a p-type impurity such as, for example, boron (B) is performed using this ion implantation mask as a mask. By this ion implantation, the p-type impurity for forming the p-type channel stopper 29b in the n-type drift layer 2b at the surface of the n-type drift layer 2b in the outer periphery of the edge termination region 60b is ion implanted.

After implantation of the p-type impurity for forming the p-type channel stopper 29b, the ion implantation mask is removed and a heat treatment for diffusing the p-type impurity is performed. By this heat treatment, the implanted p-type impurity is diffused, thereby forming the p-type channel stopper 29b. The channel stopper is formed as the p-type channel stopper 29b; however, an n-type impurity may be implanted and an n-type channel stopper may be formed.

The p-type channel stopper 29b is provided separate from the p$^-$-type well region 43, and the n-type drift layer 2b is between the p$^-$-type well region 43 and the p-type channel stopper 29b. Here, either a process for forming the p$^-$-type well region 43 or a process for forming the p-type channel stopper 29b may be performed before the other. The heat treatments for diffusing the implanted p-type impurities may be performed concurrently (may be performed in a single process).

Figure 9:
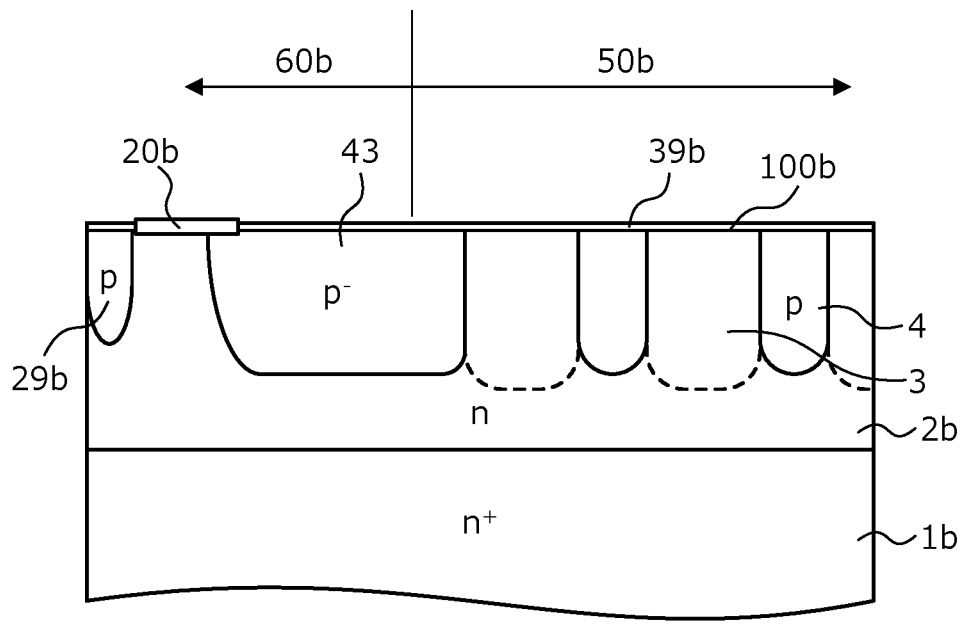
FIG. 9 is a cross-sectional view of a state of the semiconductor device according to the first embodiment during manufacture by the first method of manufacturing.

By a heat treatment that diffuses the p-type impurity, the oxide film 39b may be formed on the surface of the n-type drift layer 2b. Furthermore, the field oxide film 20b spanning the n-type drift layer 2b from an outer periphery of the p$^-$-type well region 43 near the edge termination region 60b is formed. The field oxide film 20b may be formed concurrently when the oxide film 39b is formed. The state up to here is depicted in FIG. 9.

Next, the field oxide film 20b formed on the surface 100b of the n-type drift layer 2b is formed in a desired shape by photolithography. On the oxide film 39b and the field oxide film 20b formed on the p$^-$-type well region 43, the n-type drift layer 2b, and the p-type channel stopper 29b formed in the edge termination region 60b, a polycrystalline silicon layer doped with, for example, phosphorus (P) atoms is deposited. The polycrystalline silicon layer is patterned by photolithography, thereby forming the gate wiring 17b. The field plate 38b may be formed concurrently. The gate wiring 17b and the field plate 38b are formed on the field oxide film 20b to be separate from each other.

Next, on the oxide film 39b and the field oxide film 20b formed on the surface 100b of the n-type drift layer 2b, an ion implantation mask (not depicted) having openings is formed by a photolithographic technique, using, for example, a resist. The openings are formed at positions where the n$^+$-type source regions 6b of the n-type column regions 3 formed in the n-type drift layer 2b are to be formed. An ion implantation of an n-type impurity, for example, phosphorus (P), arsenic (As), etc. is performed using this ion implantation mask as a mask. By this ion implantation, an n-type impurity for forming the n$^+$-type source regions 6b in the n-type column regions 3 at the surfaces of the n-type column regions 3 is implanted, the n-type column regions 3 being formed in the n-type drift layer 2b of the active region 50b.

Figure 10:
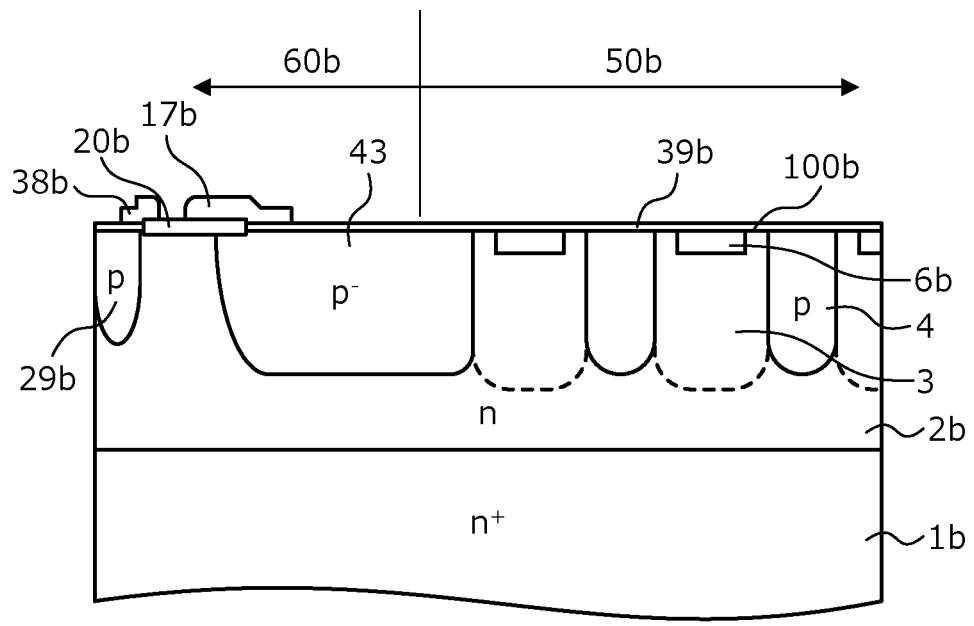
FIG. 10 is a cross-sectional view of a state of the semiconductor device according to the first embodiment during manufacture by the first method of manufacturing.

After implantation of the n-type impurity for forming the n$^+$-type source regions 6b, the ion implantation mask is removed. Next, a heat treatment for activating the n-type impurity is performed. By this heat treatment, the implanted n-type impurity is activated, thereby forming the n$^+$-type source regions 6b. In the method of manufacturing the semiconductor device according to the first embodiment, while the n$^+$-type source regions 6b are formed after the formation of the gate wiring 17b and the field plate 38b, the gate wiring 17b and the field plate 38b may be formed after the formation of the n$^+$-type source regions 6b. The state up to here is depicted in FIG. 10.

Figure 11:
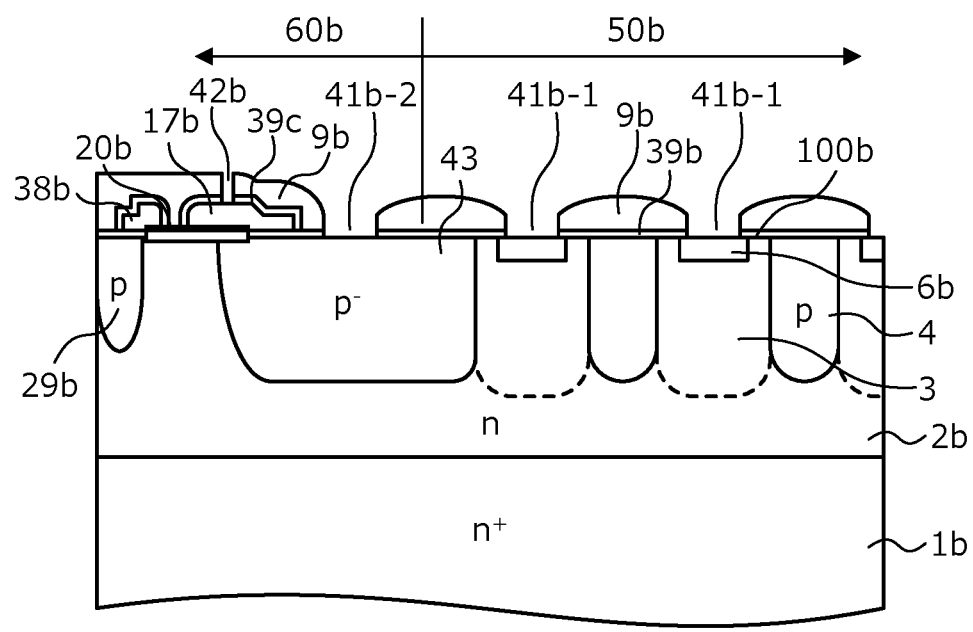
FIG. 11 is a cross-sectional view of a state of the semiconductor device according to the first embodiment during manufacture by the first method of manufacturing.

Next, the oxide film 39c is formed so as to cover the gate wiring 17b and the field plate 38b. The oxide film 39c may be stacked on the upper surfaces of the oxide film 39b and the field oxide film 20b. Next, on the oxide film 39b, the oxide film 39c, and the field oxide film 20b, the interlayer insulating film 9b having a thickness of, for example, about 1 µm is deposited. The oxide film 39b and the oxide film 39c are formed so that the interlayer insulating film 9b doped with an impurity at a high concentration is not in direct contact with the semiconductor base (the n-type drift layer 2b) that contains silicon. The oxide film 39b and the oxide film 39c are, for example, high temperature oxides (HTOs), tetraethyl orthosilicate (TEOS) films, or thermal oxide films. Next, the oxide film 39b, the oxide film 39c, and the interlayer insulating film 9b are patterned by photolithography. At upper portions of the n-type column regions 3, the contact holes 41b-1 exposing the n$^+$-type source regions 6b are formed. On the upper surface of the p$^-$-type well region 43 in the edge termination region 60b, the contact hole 41b-2 that exposes the p$^-$-type well region 43 is formed. Thereafter, a heat treatment (reflow) is performed, planarizing the interlayer insulating film 9b. Next, at an upper surface of the gate wiring 17b, the contact hole 42b exposing the gate wiring 17b is formed. The state up to here is depicted in FIG. 11. The contact hole 42b may be formed concurrently with the contact holes 41b-1 and the contact hole 41b-2.

Next, on an upper portion of the n-type drift layer 2b at the surface 100b thereof, a metal film containing aluminum or an alloy containing aluminum as a main constituent is deposited in an entire area of the surface. Next, the metal film is patterned by a photolithographic technique and an etching technique, thereby forming the drain electrode 12 and the gate electrode 44. Further, the gate electrode pad (not depicted) in contact with the gate electrode 44 is also formed. Before the metal film is deposited, the barrier metal 15b formed by a titanium film (Ti), a titanium nitride film (TiN), or a stacked film of these (for example, Ti/TiN, etc.) may be formed by sputtering.

The metal film is embedded in the contact holes 41b-1, whereby the n$^+$-type source regions 6b and the drain electrode 12 are connected electrically. Further, the metal film is embedded in the contact hole 41b-2, whereby the p$^-$-type well region 43 and the gate electrode 44 are connected electrically. In the contact holes 41b-1, 41b-2, the contact plugs 14b may be embedded via the barrier metal 15b. By embedding the metal film in the contact hole 42b formed so as to expose the gate wiring 17b, the gate wiring 17b and the gate electrode 44 are connected electrically. Thus, the gate electrode 44 is connected electrically to the p-type column regions 4 that are connected electrically to the p$^-$-type well region 43.

Next, on a back surface (the back surface of the semiconductor base) of the n$^+$-type semiconductor substrate 1b, as a back electrode (not depicted), a metal film containing, for example, nickel (Ni), titanium (Ti), gold (Au), silver (Ag), aluminum (Al), an alloy having aluminum as a main constituent, or a stacked film of these (for example, Ti/Ni/Au, Al/Ti/Ni/Au, etc.) is deposited. Further, a heat treatment is performed, thereby forming an ohmic contact between the n$^+$-type semiconductor substrate 1b and the back electrode 11b. Thus, the junction FET 90 depicted in FIG. 1 is completed.

FIGS. 12, 13, 14, 15, and 16 are cross-sectional views of states of the semiconductor device according to the first embodiment during manufacture by a second method of manufacturing. In the second method of manufacturing, a method of manufacturing the parallel pn region 32 differs from that in the first method of manufacturing and therefore, only the method of manufacturing the parallel pn region 32 is described.

First, the n$^+$-type semiconductor substrate 1b that forms the n$^+$-type drain layer is prepared. Next, on the surface of the n$^+$-type semiconductor substrate 1b, the n-type drift layer 2b having an impurity concentration lower than the impurity concentration of the n$^+$-type semiconductor substrate 1b is epitaxially grown. Here, while an instance in which the n$^+$-type semiconductor substrate 1b contains silicon (Si) is depicted, the n$^+$-type semiconductor substrate 1b may contain silicon carbide (SiC).

Figure 12:
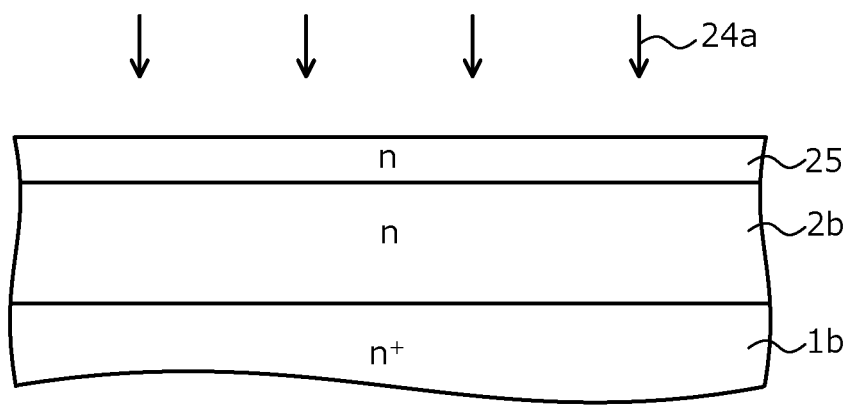
FIG. 12 is a cross-sectional view of a state of the semiconductor device according to the first embodiment during manufacture by a second method of manufacturing.

Next, an ion implantation 24a of an n-type impurity is performed at the surface of the n-type drift layer 2b. By this ion implantation, an n-type layer 25 implanted with the n-type impurity is formed in a surface layer of the n-type drift layer 2b. The state up to here is depicted in FIG. 12.

Figure 13:
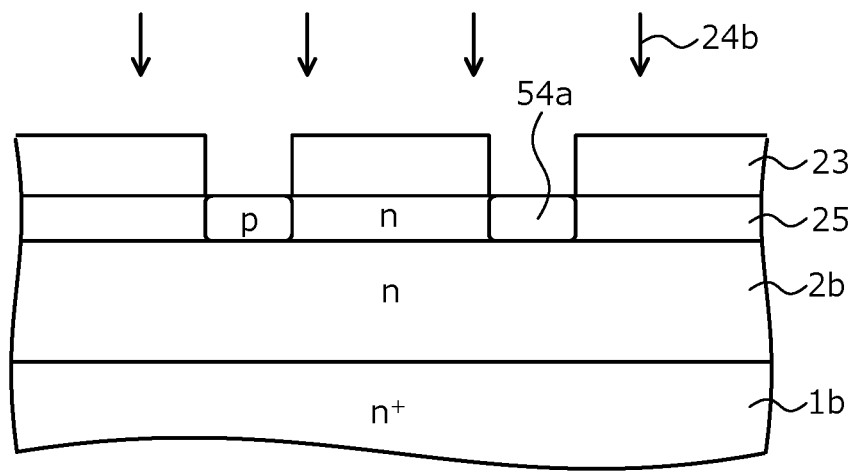
FIG. 13 is a cross-sectional view of a state of the semiconductor device according to the first embodiment during manufacture by the second method of manufacturing.

Next, on the surface of the n-type layer 25, the ion implantation mask 23 having predetermined openings is formed by a photolithographic technique, using, for example, a photoresist. The openings are formed at positions where the p-type column regions 4 are to be provided. An ion implantation 24b of a p-type impurity such as, for example, boron (B) is performed using the ion implantation mask 23 as a mask. By this ion implantation, the first p-type column implanted regions 54a are formed in the n-type layer 25 at the surface of the n-type layer 25. The state up to here is depicted in FIG. 13. Next, the ion implantation mask 23 is removed.

Figure 14:
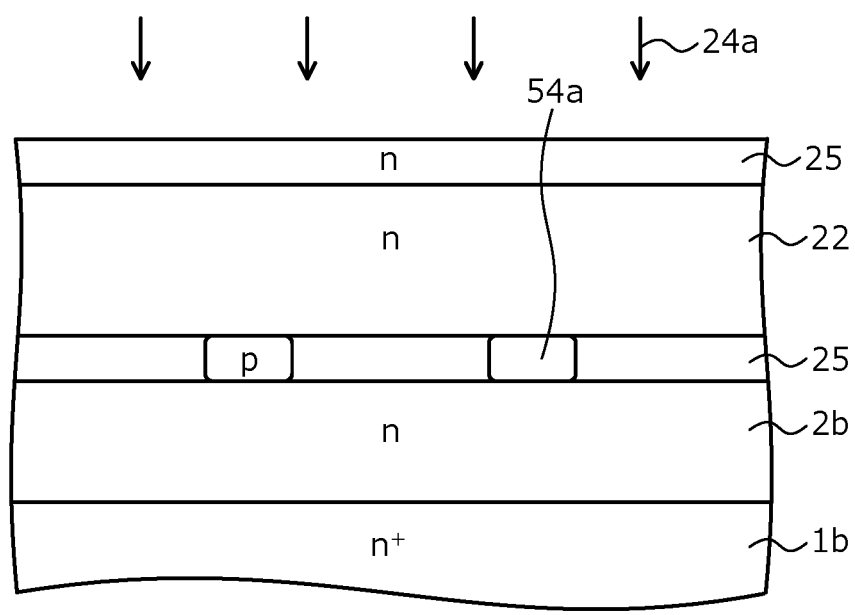
FIG. 14 is a cross-sectional view of a state of the semiconductor device according to the first embodiment during manufacture by the second method of manufacturing.

Next, on the surface of the n-type layer 25, the n-type epitaxial layer 22 having an impurity concentration higher than the impurity concentration of the n-type drift layer 2b is epitaxially grown. The ion implantation 24a of an n-type impurity is performed at the surface of the n-type epitaxial layer 22. By this ion implantation, the n-type layer 25 implanted with the n-type impurity is formed in a surface layer of the n-type epitaxial layer 22. The state up to here is depicted in FIG. 14.

Figure 15:
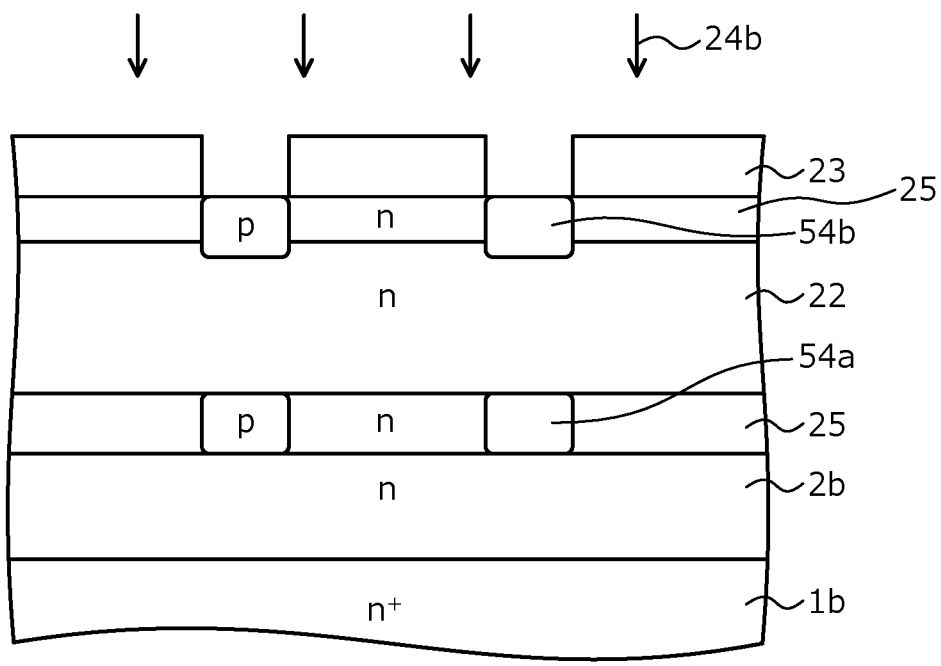
FIG. 15 is a cross-sectional view of a state of the semiconductor device according to the first embodiment during manufacture by the second method of manufacturing.

Next, on the surface of the n-type layer 25, the ion implantation mask 23 having predetermined openings is formed by a photolithographic technique, using, for example, a photoresist. The openings are formed at positions where the p-type column regions 4 are to be provided. The ion implantation 24b of a p-type impurity such as, for example, boron (B) is performed using the ion implantation mask 23. By this ion implantation, the second p-type column implanted regions 54b are formed in the n-type layer 25 at the surface of the n-type layer 25. The state up to here is depicted in FIG. 15. Next, the ion implantation mask 23 is removed.

Figure 16:
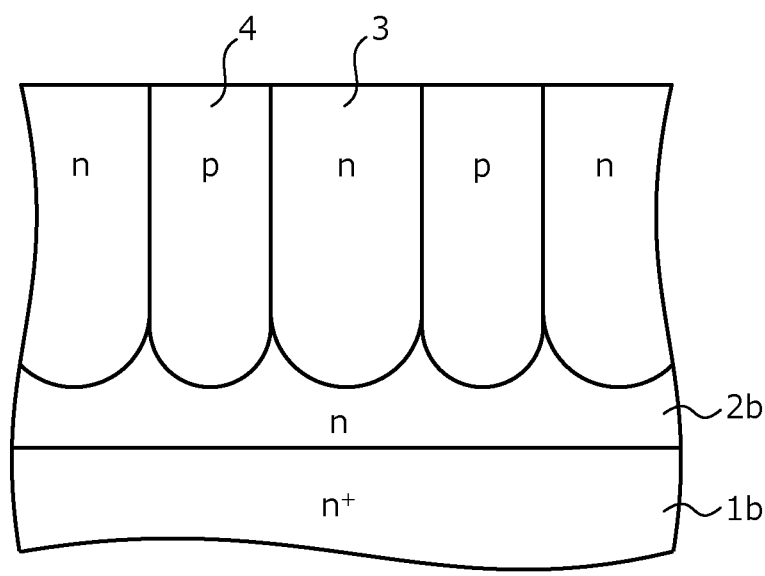
FIG. 16 is a cross-sectional view of a state of the semiconductor device according to the first embodiment during manufacture by the second method of manufacturing.

Thereafter, the epitaxial growth, the ion implantation 24a, the formation of the ion implantation mask 23, the ion implantation 24b, and the removal of the ion implantation mask 23 are sequentially repeated a predetermined number of times. Next, a heat treatment for diffusing the n-type layer 25 implanted with an n-type impurity, the first p-type column implanted regions 54a and the second p-type column implanted regions 54b implanted with a p-type impurity and formed by the ion implantations 24a, 24b is performed, whereby the n-type column regions 3 and the p-type column regions 4 are formed. The state up to here is depicted in FIG. 16.

FIGS. 17, 18, 19, and 20 are cross-sectional views of states of the semiconductor device according to the first embodiment during manufacture by a third method of manufacturing. In the third method of manufacturing, a method of manufacturing the parallel pn region 32 differs from that in the first method of manufacturing and therefore, only the method of manufacturing the parallel pn region 32 is described.

First, the n$^+$-type semiconductor substrate 1b that forms the n$^+$-type drain layer is prepared. Next, on the surface of the n$^+$-type semiconductor substrate 1b, the n-type drift layer 2b having an impurity concentration lower than the impurity concentration of the n$^+$-type semiconductor substrate 1b is epitaxially grown. Here, while an instance in which the n$^+$-type semiconductor substrate 1b contains silicon (Si) is depicted, the n$^+$-type semiconductor substrate 1b may contain silicon carbide (SiC).

Figure 17:
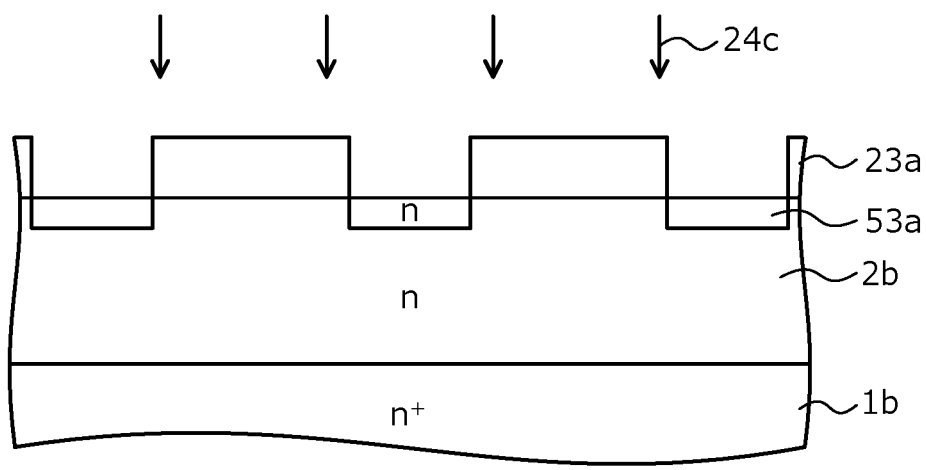
FIG. 17 is a cross-sectional view of a state of the semiconductor device according to the first embodiment during manufacture by a third method of manufacturing.

Next, on the surface of the n-type drift layer 2b, an ion implantation mask 23a having predetermined openings is formed by a photolithographic technique, using, for example, a photoresist. The openings are at positions where the n-type column regions 3 are to be provided. An ion implantation 24c of an n-type impurity using the ion implantation mask 23a as a mask is performed at the surface of the n-type drift layer 2b. By the ion implantation 24c, first n-type column implanted regions 53a are formed in the n-type drift layer 2b, at the surface of the n-type drift layer 2b. The state up to here is depicted in FIG. 17. Next, the ion implantation mask 23a is removed.

Figure 18:
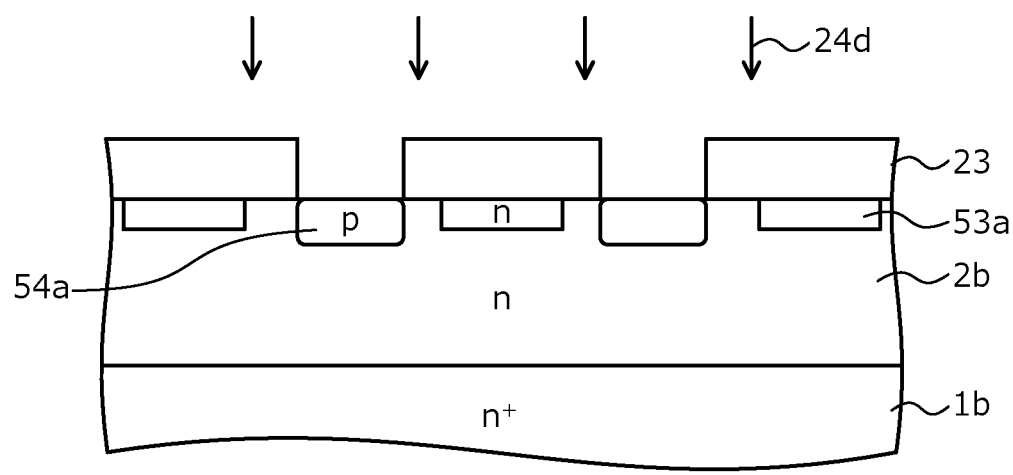
FIG. 18 is a cross-sectional view of a state of the semiconductor device according to the first embodiment during manufacture by the third method of manufacturing.

Next, on the surface of the n-type drift layer 2b, the ion implantation mask 23 having predetermined openings is formed by a photolithographic technique, using, for example, a photoresist. The openings are formed at positions where the p-type column regions 4 are to be provided. An ion implantation 24d of a p-type impurity such as, for example, boron (B) is performed using the ion implantation mask 23 as a mask. By this ion implantation, the first p-type column implanted regions 54a are formed in the n-type drift layer 2b at the surface of the n-type drift layer 2b. The state up to here is depicted in FIG. 18. Next, the ion implantation mask 23 is removed.

Figure 19:
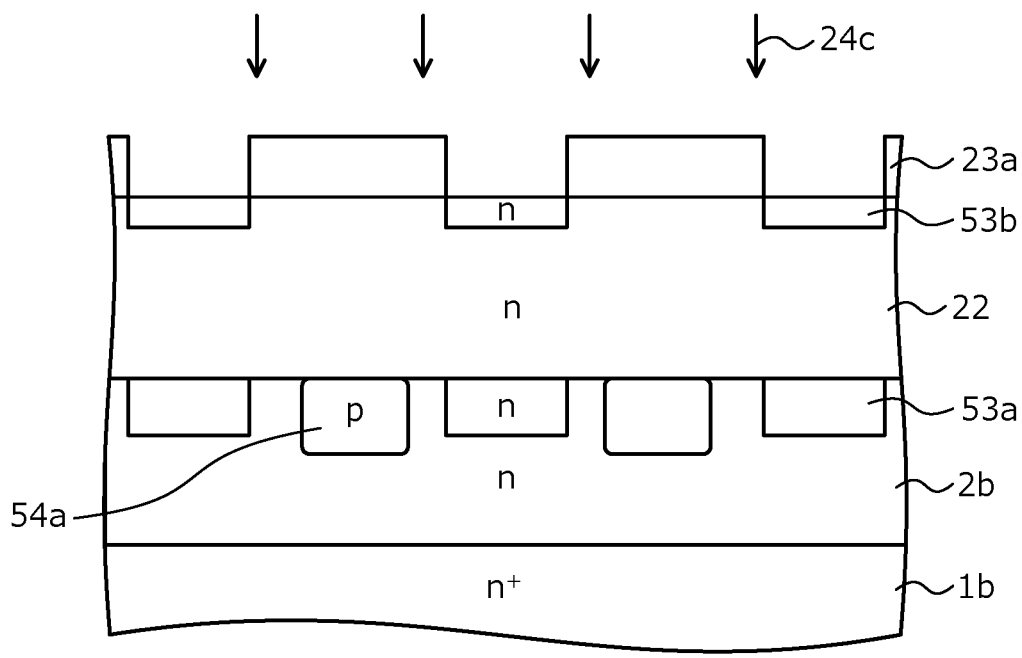
FIG. 19 is a cross-sectional view of a state of the semiconductor device according to the first embodiment during manufacture by the third method of manufacturing.

Next, on the surface of the n-type drift layer 2b, the n-type epitaxial layer 22 having an impurity concentration higher than the impurity concentration of the n-type drift layer 2b is epitaxially grown. Next, on the surface of the n-type drift layer 2b, the ion implantation mask 23a having predetermined openings is formed by a photolithographic technique, using, for example, a photoresist. The openings are at positions where the n-type column regions 3 are to be provided. The ion implantation 24c of an n-type impurity is performed at the surface of the n-type epitaxial layer 22, using the ion implantation mask 23a as a mask. By the ion implantation 24c, second n-type column implanted regions 53b are formed in the n-type epitaxial layer 22 at the surface of the n-type epitaxial layer 22. The state up to here is depicted in FIG. 19. Next, the ion implantation mask 23a is removed.

Figure 20:
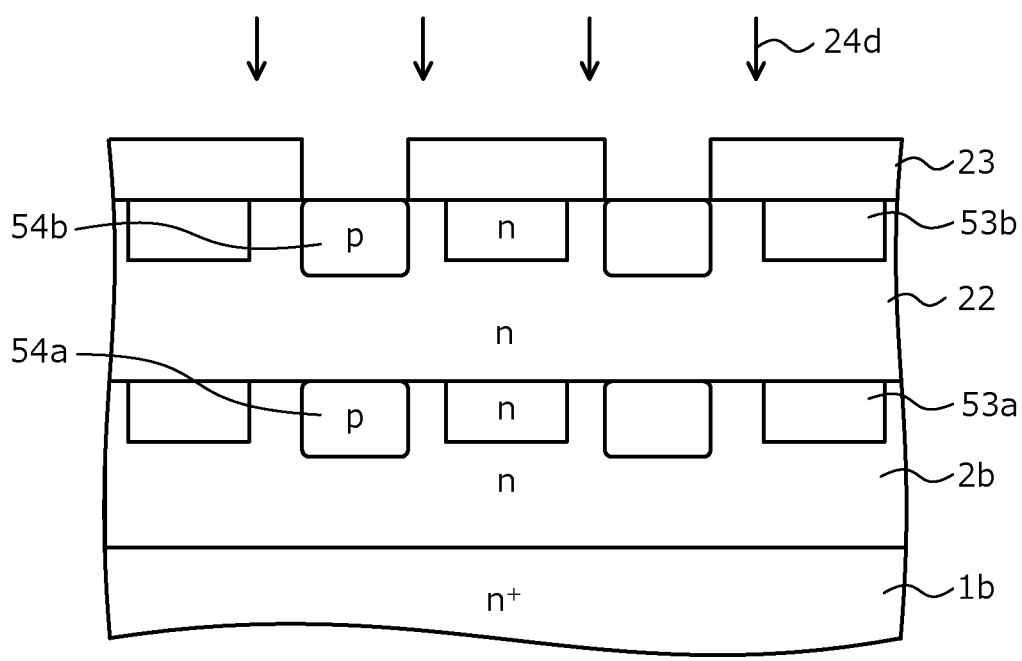
FIG. 20 is a cross-sectional view of a state of the semiconductor device according to the first embodiment during manufacture by the third method of manufacturing.

Next, on the surface of the n-type epitaxial layer 22, the ion implantation mask 23 having predetermined openings is formed by a photolithographic technique, using, for example, a photoresist. The openings are formed at positions where the p-type column regions 4 are to be provided. The ion implantation 24d of a p-type impurity such as, for example, boron (B) is performed using the ion implantation mask 23 as a mask. By the ion implantation 24d, the second p-type column implanted regions 54b are formed in the n-type epitaxial layer 22 at the surface of the n-type epitaxial layer 22. The state up to here is depicted in FIG. 20. Next, the ion implantation mask 23 is removed.

Thereafter, the epitaxial growth, the formation of the ion implantation mask 23a, the ion implantation 24c, the removal of ion implantation mask 23a, the formation of the ion implantation mask 23, the ion implantation 24d, and the removal of the ion implantation mask 23 are sequentially repeated a predetermined number of times. Next, a heat treatment for diffusing the first n-type column implanted regions 53a and the second n-type column implanted regions 53b implanted with an n-type impurity and formed by the ion implantation 24c, and the first p-type column implanted regions 54a and the second p-type column implanted regions 54b implanted with a p-type impurity by the ion implantation 24d is performed, whereby the n-type column regions 3 and the p-type column regions 4 are formed (refer to FIG. 16).

FIGS. 21, 22, 23, 24, 25, and 26 are cross-sectional views of states of the semiconductor device according to the first embodiment during manufacture by a fourth method of manufacturing. In the fourth method of manufacturing, a method of manufacturing the parallel pn region 32 differs from that in the first method of manufacturing and therefore, only the method of manufacturing the parallel pn region 32 is described.

First, the $n^+$-type semiconductor substrate 1b that forms the $n^+$-type drain layer is prepared. Next, on the surface of the $n^+$-type semiconductor substrate 1b, the n-type drift layer 2b having an impurity concentration lower than the impurity concentration of the $n^+$-type semiconductor substrate 1b is epitaxially grown. Here, while an instance in which the $n^+$-type semiconductor substrate 1b contains silicon (Si) is depicted, the $n^+$-type semiconductor substrate 1b may contain silicon carbide (SiC). Next, on the surface of the n-type drift layer 2b, the n-type epitaxial layer 22 having an impurity concentration higher than the impurity concentration of the n-type drift layer 2b is epitaxially grown.

Figure 21:
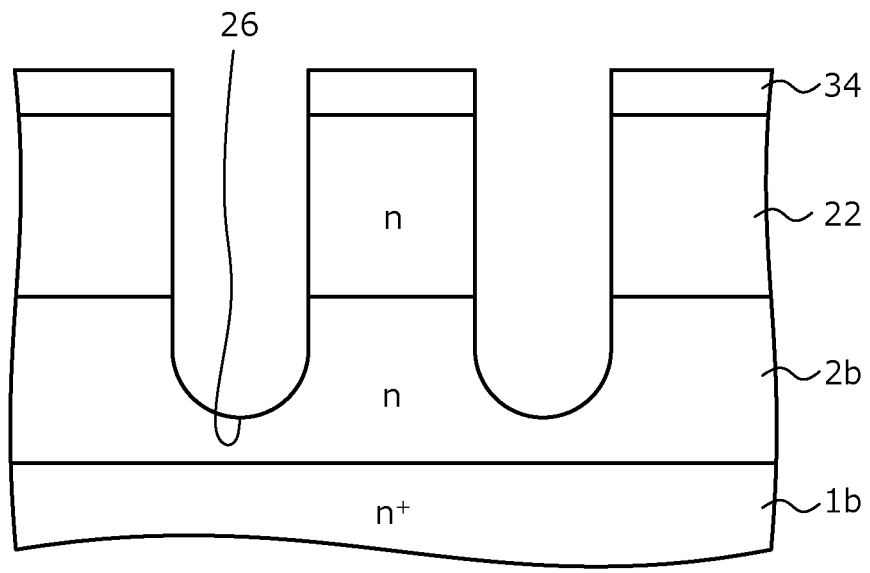
FIG. 21 is a cross-sectional view of a state of the semiconductor device according to the first embodiment during manufacture by a fourth method of manufacturing.

Next, on the surface of the n-type epitaxial layer 22, an oxide film is formed and by a photolithographic technique, an oxide film 34 having predetermined openings is formed. The openings are formed at positions where the p-type column regions 4 are to be provided. Next, p-type column trenches 26 that reach the n-type drift layer 2b from the surface of the n-type epitaxial layer 22 are formed by, for example, by anisotropic dry etching using the oxide film 34 as a mask. The state up to here is depicted in FIG. 21.

Figure 22:
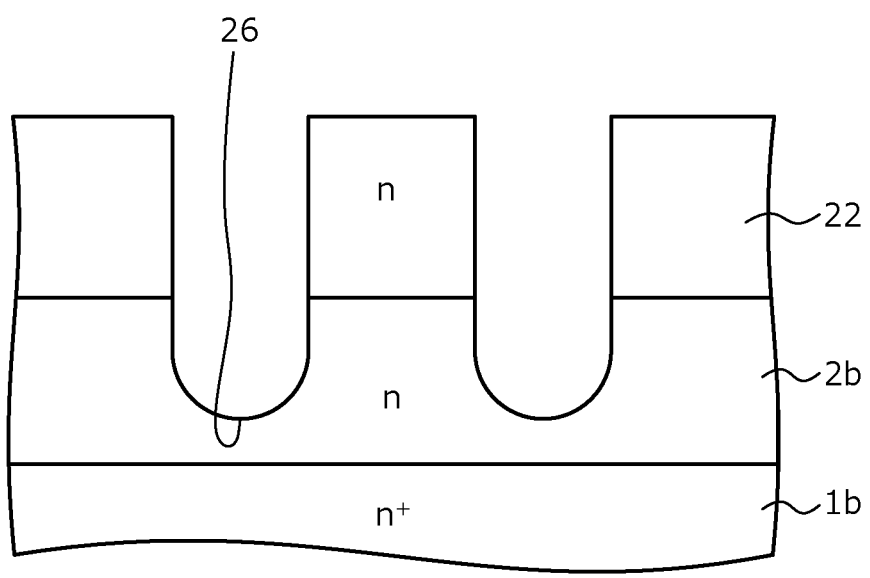
FIG. 22 is a cross-sectional view of a state of the semiconductor device according to the first embodiment during manufacture by the fourth method of manufacturing.
Figure 23:
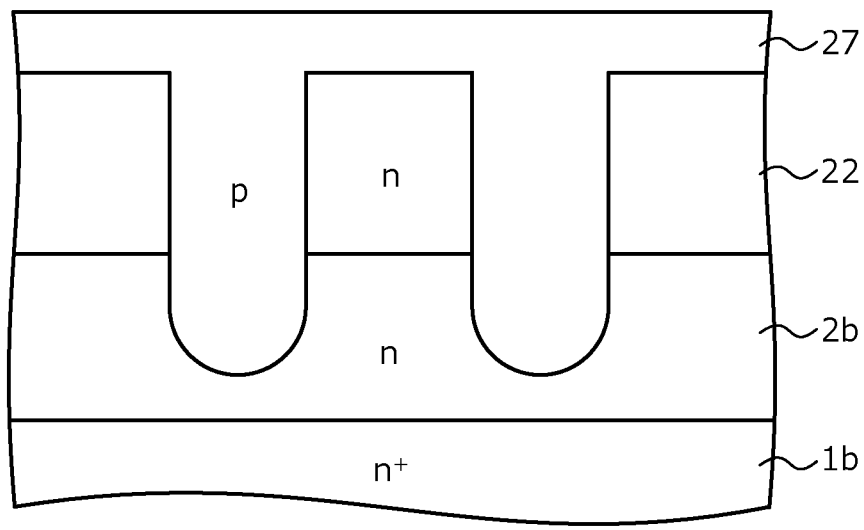
FIG. 23 is a cross-sectional view of a state of the semiconductor device according to the first embodiment during manufacture by the fourth method of manufacturing.

Next, the oxide film 34 used for forming the p-type column trenches 26 is removed. The state up to here is depicted in FIG. 22. Next, a p-type epitaxial layer 27 is epitaxially grown so as to cover the surface of the n-type epitaxial layer 22 and be embedded in the p-type column trenches 26. The state up to here is depicted in FIG. 23.

Figure 24:
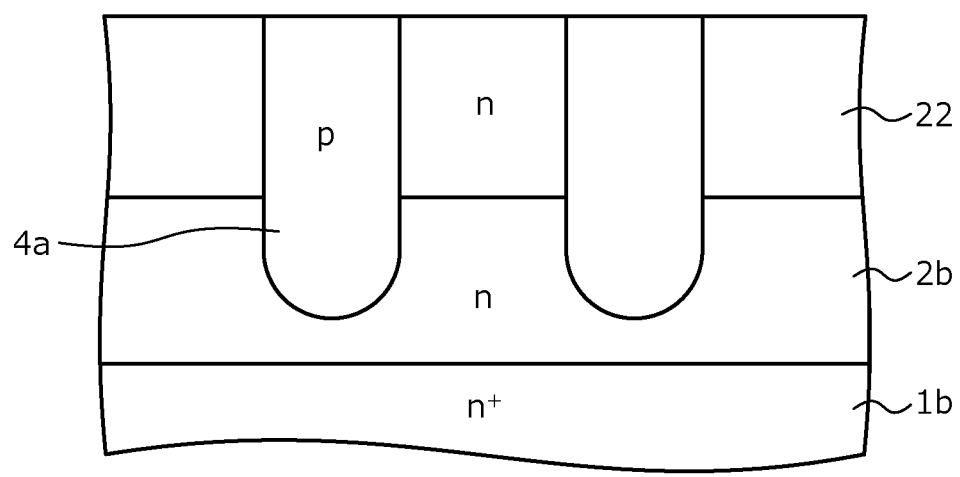
FIG. 24 is a cross-sectional view of a state of the semiconductor device according to the first embodiment during manufacture by the fourth method of manufacturing.

Next, the surface of the p-type epitaxial layer 27 is polished by chemical mechanical polishing (CMP), exposing the n-type epitaxial layer 22. As a result, first p-type column regions 4a are formed. The state up to here is depicted in FIG. 24.

Figure 25:
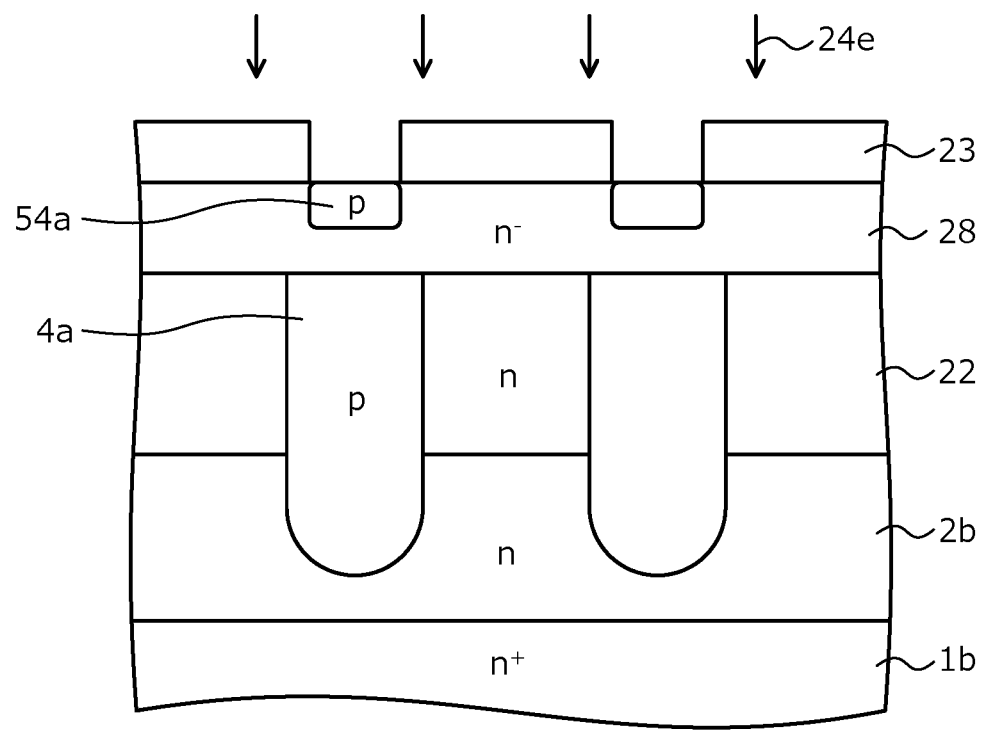
FIG. 25 is a cross-sectional view of a state of the semiconductor device according to the first embodiment during manufacture by the fourth method of manufacturing.

Next, on the surface of the n-type epitaxial layer 22, an $n^-$-type epitaxial layer 28 having an impurity concentration lower than the impurity concentration of the n-type epitaxial layer 22 is epitaxially grown. Next, on the surface of the $n^-$-type epitaxial layer 28, the ion implantation mask 23 having predetermined openings is formed by a photolithographic technique, using, for example, a photoresist. The openings are formed at positions where the p-type column regions 4 are to be provided. An ion implantation 24e of a p-type impurity such as, for example, boron (B) is performed using the ion implantation mask 23 as a mask. By the ion implantation 24e, the first p-type column implanted regions 54a are formed in the $n^-$-type epitaxial layer 28 at the surface of the $n^-$-type epitaxial layer 28. The state up to here is depicted in FIG. 25. Next, the ion implantation mask 23 is removed.

Figure 26:
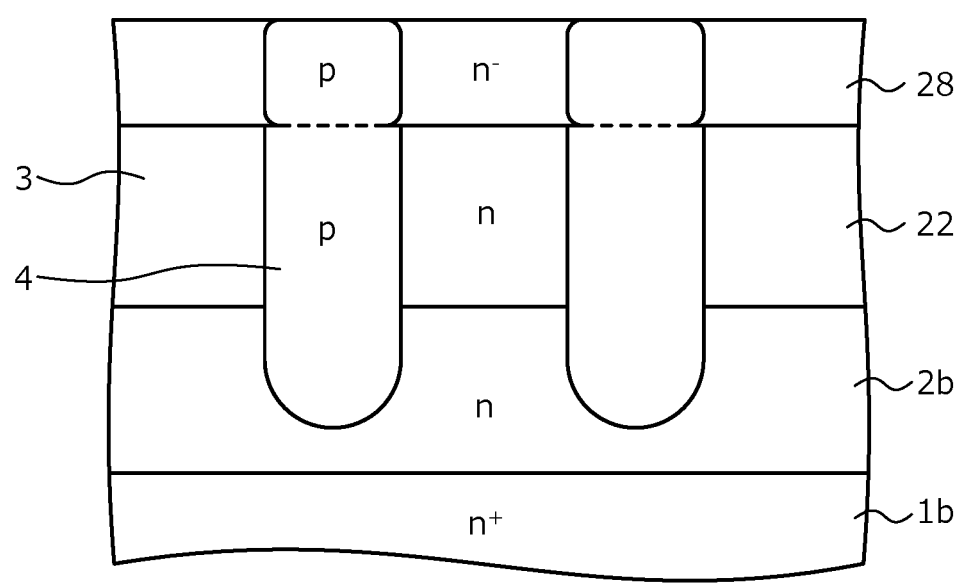
FIG. 26 is a cross-sectional view of a state of the semiconductor device according to the first embodiment during manufacture by the fourth method of manufacturing.

Next, a heat treatment for diffusing the first p-type column implanted regions 54a implanted with a p-type impurity by the ion implantation is performed. By this heat treatment, the impurity implanted in the first p-type column implanted regions 54a is diffused and the diffused p-type impurity connects the first p-type column regions 4a, whereby the p-type column regions 4 are formed. Portions of the n-type drift layer 2b, the n-type epitaxial layer 22, and the $n^-$-type epitaxial layer 28 sandwiched between adjacent p-type column regions 4 of the p-type column regions 4 form the n-type column regions 3. The state up to here is depicted in FIG. 26.

Next, a method of manufacturing the enhancement mode MOSFET 80 is described. First, the $n^+$-type semiconductor substrate 1a that forms the $n^+$-type drain layer is prepared. Next, on the surface of the $n^+$-type semiconductor substrate 1a, the n-type drift layer 2b having an impurity concentration lower than the impurity concentration of the $n^+$-type semiconductor substrate 1b is epitaxially grown. Here, while an instance in which the $n^+$-type semiconductor substrate 1b contains silicon (Si) is depicted, the $n^+$-type semiconductor substrate 1b may contain silicon carbide (SiC).

Next, an oxide film is formed on the upper surface of the n-type drift layer 2a. The oxide film is patterned using a photolithographic technique and an etching technique, thereby forming the field oxide film 20a. The field oxide film 20a may be a LOCOS film. A resist mask having an opening for forming the $p^{--}$-type RESURF region 31a is formed using a photographic technique at a predetermined position of the field oxide film 20a in the edge termination region 60a. After an ion implantation of a p-type impurity using this resist mask is performed, a heat treatment that diffuses the p-type impurity is performed, thereby forming the $p^-$-type RESURF region 31a. Furthermore, a heat treatment is performed, whereby an oxide film is grown on the surface 100a of the n-type drift layer 2a. The heat treatment that diffuses the p-type impurity and the process of growing the oxide film on the surface 100a of the n-type drift layer 2a may be performed concurrently. The oxide film grown on the surface 100a of the n-type drift layer 2a is subject to a photolithographic technique and an etching technique, thereby forming an oxide film mask having predetermined openings. The openings are formed at positions where the trenches 18 are to be provided. Next, dry etching is performed using the formed oxide film mask as a mask, thereby forming the trenches 18.

Next, with the oxide film mask attached as is, isotropic etching for removing damage of the trenches 18 and/or sacrificial oxidation for rounding corners of openings of the trenches 18 and bottoms of the trenches 18 may be performed. Either the isotropic etching or the sacrificial oxidation alone may be performed. In an instance in which both the isotropic etching and the sacrificial oxidation are performed, either one may be performed first. A portion of the oxide film mask in the edge termination region 60a and the oxide film mask formed in the active region 50a may be removed concurrently with an oxide film formed by the sacrificial oxidation.

Next, after removal of the oxide film mask formed in the active region 50a and a portion of the oxide film mask in the edge termination region 60a, the gate insulating films 7a are formed along the surface 100a of the n-type drift layer 2a and inner walls of the trenches 18. The gate insulating films 7a may be formed by thermal oxidation of a temperature of about 1000 degrees C. under an oxygen atmosphere. Further, these gate insulating films 7a may be formed by a deposition method by a chemical reaction such as that for a high temperature oxide (HTO). The gate insulating films 7a may be on the upper surface of the oxide film 39 left in the edge termination region 60a.

Next, on the gate insulating films 7a, a polycrystalline silicon layer doped with, for example, phosphorus atoms is provided. The polycrystalline silicon layer is formed so as to be embedded in the trenches 18. The polycrystalline silicon layer formed in the active region 50a is etched, thereby forming the gate electrodes 8 on the gate insulating films 7a formed in the trenches 18. The polycrystalline silicon layer formed in the edge termination region 60a is patterned by photolithography, whereby the gate wiring 17a and the field plate 38a are formed. The gate wiring 17a and the field plate 38b are separate from one another and electrically insulated from one another by the upper surface of the field oxide film 20a.

Next, an ion implantation that implants a p-type impurity for forming the p-type base regions 5a is performed. At this time, the gate electrodes 8 function as masks. The p-type impurity is, for example, boron (B), etc. After the ion implantation, a heat treatment that diffuses the p-type impurity is performed. Next, an ion implantation that implants an n-type impurity for forming the $n^+$-type source regions 6a is performed. Thereafter, a heat treatment that activates the n-type impurity is performed, whereby the $n^+$-type source regions 6a are formed in the p-type base regions 5a at respective surfaces of the p-type base regions 5a. Further, in the edge termination region 60a, an ion implantation that implants a p-type impurity for forming a portion of the $p^{---}$-type RESURF region 31a and the p-type channel stopper 29a is performed. At this time, the gate wiring 17a, the field oxide film 20a, and the p-type channel stopper 29a function as masks. As necessary, a mask having predetermined openings may be formed by a photolithographic technique using a resist and may be used as a mask. After the ion implantation, a heat treatment that diffuses the implanted p-type impurity is performed, whereby the $p^{---}$-type RESURF region 31a and the p-type channel stopper 29a are formed. The p-type channel stopper 29a may be an n-type.

In the methods of manufacturing described above, after a gate structure configured by the trenches 18, the gate insulating films 7a, and the gate electrodes 8 is formed, the p-type base regions 5a are formed, however, after the p-type base regions 5a are formed, the gate structure configured by the trenches 18, the gate insulating films 7a, and the gate electrodes 8 may be formed. Further, after the p-type base regions 5a and the $n^+$-type source regions 6a are formed, the gate structure configured by the trenches 18, the gate insulating films 7a, and the gate electrodes 8 may be formed.

Next, the oxide film 39a is formed so as to cover the $n^+$-type source regions 6a, the gate electrodes 8, the $p^{---}$-type RESURF region 31a, and the p-type channel stopper 29a. On the upper surface of the oxide film 39a, the interlayer insulating film 9a having a thickness of about 1 μm and containing, for example, phosphate glass is deposited. The oxide film 39a is formed so that the interlayer insulating film 9a doped with a high concentration of an impurity is not directly in contact with the $n^+$-type source regions 6a, the gate electrodes 8, the $p^{---}$-type RESURF region 31a, or the p-type channel stopper 29a. The oxide film 39a is, for example, a high temperature oxide (HTO), a tetraethyl orthosilicate (TEOS) film, or a thermal oxide film.

Next, the oxide film 39a and the interlayer insulating film 9a are patterned by photolithography. In the active region 50a, the contact holes 41a-1 that expose the $n^+$-type source regions 6a and the p-type base regions 5a are formed. At bottoms of the contact holes 41a-1, the $p^{++}$-type contact regions 33 may be formed. The contact holes 41a-1 may be formed as trenches that penetrate through the $n^+$-type source regions 6a and reach the p-type base regions 5a. Bottoms of the trenches may be underlied by the $p^{++}$-type contact regions 33 and sidewalls of the trenches may be in contact with the $n^+$-type source regions 6a.

In the edge termination region 60a, the contact hole 41a-2 that exposes the $p^{---}$-type RESURF region 31a is formed. At a bottom of the contact hole 41a-2, one of the $p^{++}$-type contact regions 33 may be formed. The contact hole 41a-2 may be formed in the $p^{---}$-type RESURF region 31a as one of multiple trenches that form the contact holes 41a-1, and the bottom and sidewalls of the trench may be underlied by one of the $p^{++}$-type contact regions 33. Thereafter, a heat treatment (reflow) is performed, thereby planarizing the interlayer insulating film 9a. Next, in the edge termination region 60a, the contact hole 42a that exposes the gate wiring 17a is formed. The contact hole 42a may be formed concurrently with the contact holes 41a-1, 41a-2.

Next, by sputtering, a metal film containing aluminum or an alloy containing aluminum as a main constituent is deposited so as to cover the upper surface of the interlayer insulating film 9a and to be embedded in the contact holes 41a-1, 41a-2, 42a. Next, the metal film is patterned by a photolithographic technique and an etching technique, whereby the source electrode 10 and the gate runner 13a, and the gate electrode pad (not depicted) in contact with the gate runner 13a are formed.

Before the metal film is deposited, the barrier metal 15a formed by a titanium film (Ti), a titanium nitride film (TiN), or a stacked film of these (for example, Ti/TiN, etc.) may be formed in the contact holes 41a-1, 41a-2 by sputtering. In the contact holes 41a-1, 41a-2, the contact plugs 14a may be embedded via the barrier metal 15a. In this instance, the contact holes 41a-1, 41a-2 are formed by trenches, whereby parasitic bipolar operation may be suppressed. The source electrode 10 is connected electrically to the p-type base regions 5a. The gate runner 13a is connected to the gate wiring 17a. The gate runner 13a is connected electrically to the gate electrodes 8 connected to the gate wiring 17a.

Next, on the back surface (the back surface of the semiconductor base) of the $n^+$-type semiconductor substrate 1a, as the back electrode 11a, a metal film containing, for example, nickel (Ni), titanium (Ti), gold (Au), silver (Ag), aluminum (Al), an alloy containing aluminum as a main constituent, or a stacked film of these (for example, Ti/Ni/Au, Al/Ti/Ni/Au, etc.) is deposited by sputtering. After the back electrode 11a is deposited, a heat treatment is performed, whereby the $n^+$-type semiconductor substrate 1a is in ohmic contact with the back electrode 11a. Thus, the enhancement mode MOSFET 80 is completed.

As described above, according to the first embodiment, the drain electrode (the back electrode 11a) of the enhancement mode MOSFET 80 and the drain electrode (the back electrode 11b) of the junction FET 90 are connected to each other. The source electrode of the enhancement mode MOSFET 80 is regarded as the source electrode 10 of the semiconductor device 70 and the source electrode of the junction FET 90 is regarded as the drain electrode 12 of the semiconductor device 70. As a result, in an instance in which the battery is connected properly, the parasitic diode in the enhancement mode MOSFET 80 blocks large current flowing from the battery and the junction FET 90 does not block the current. On the other hand, when the battery is connected in reverse, while the enhancement mode MOSFET 80 is unable to block large current that flows from the battery, application of a predetermined voltage to the gate electrode 44 of the junction FET 90 enables blocking of the large current that flows from the battery. Further, the junction FET 90 having a resistance lower than that of the conventional semiconductor device that uses the p-channel MOSFET 102 depicted in FIG. 34 and lower than that of the conventional semiconductor device that uses the diode 103 depicted in FIG. 35 is used and therefore, increases in the ON resistance may be suppressed to be low. Furthermore, the enhancement mode MOSFET 80 and the junction FET 90 do not use a Schottky connection and therefore, increases in leak current may be suppressed.

Figure 27:
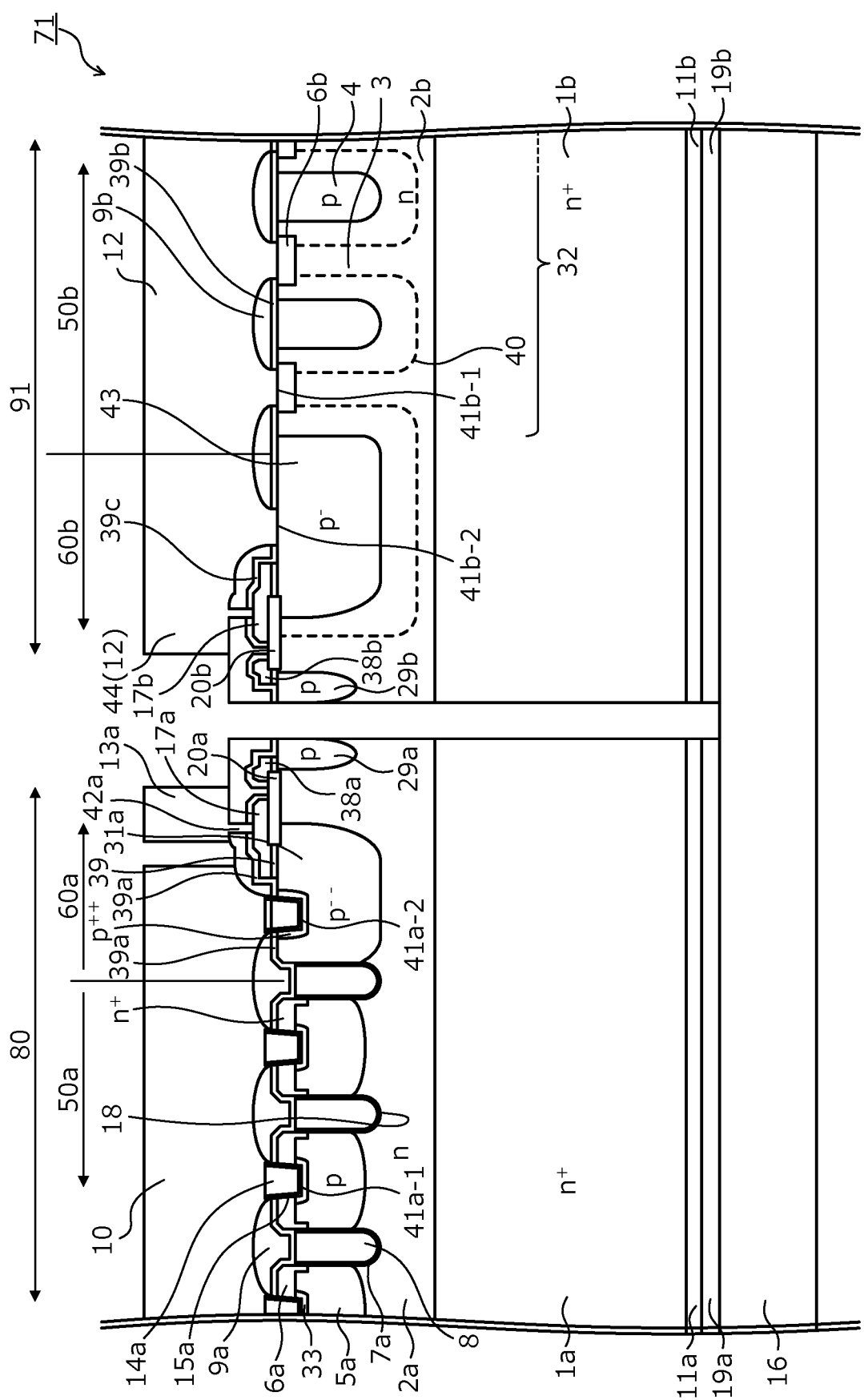
FIG. 27 is a cross-sectional view depicting a structure of a semiconductor device according to a second embodiment.
Figure 28:
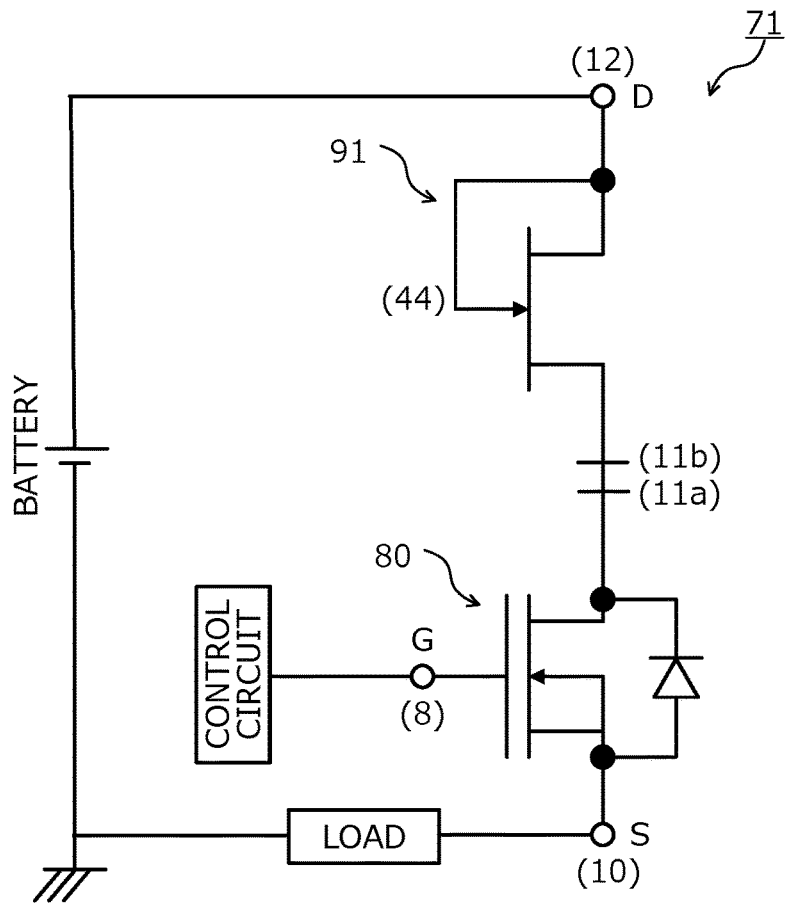
FIG. 28 is an equivalent circuit diagram of the semiconductor device 71 according to the second embodiment.

Next, a structure of a semiconductor device 71 according to a second embodiment is described. FIG. 27 is a cross-sectional view depicting the structure of the semiconductor device 71 according to the second embodiment. As depicted in FIG. 27, the semiconductor device 71 according to the second embodiment differs from the semiconductor device 70 according to the first embodiment in that, in a junction FET 91, the drain electrode 12 and the gate electrode 44 are integrated, and the drain electrode 12 and the gate electrode 44 are connected electrically. Further, in the second embodiment, while the contact plugs 14*b* and the barrier metal 15*b* are not provided in the contact holes 41*b*-1, 41*b*-2 of the junction FET 91, the contact plugs 14*b* and the barrier metal 15*b* may be provided in the contact holes 41*b*-1, 41*b*-2 of the junction FET 91 similarly to the first embodiment depicted in FIG. 1. FIG. 28 is an equivalent circuit diagram of the semiconductor device 71 according to the second embodiment. In FIG. 28, the gate electrodes 8, the source electrode 10, the gate electrode 44, the drain electrode 12, and the back electrodes 11*a*, 11*b* of the semiconductor device 71 according to the second embodiment are indicated by reference numerals in parentheses.

In the equivalent diagram depicted in FIG. 28, an instance is depicted in which the battery is connected correctly (connected in sequence) to the semiconductor device 71 according to the second embodiment. When the battery is connected in sequence to the semiconductor device 71, current flowing from the battery flows from the drain electrode 12 (the drain D in FIG. 28) of the junction FET 91 to the back electrode 11*b*. The enhancement mode MOSFET 80 is assumed to be connected in the forward direction and the parasitic diode of the enhancement mode MOSFET 80 is assumed to be connected in the reverse direction. In this instance, in a state in which a voltage signal that is from the control circuit and turns ON the enhancement mode MOSFET 80 is not applied to the gate electrodes 8 (OFF state) and current does not flow from the junction FET 91 to the enhancement mode MOSFET 80. When a voltage signal that is from the control circuit and turns ON the enhancement mode MOSFET 80 is applied to the gate electrodes 8, current from the battery and passing through the junction FET 91 flows to the enhancement mode MOSFET 80. Current flowing from the back electrode 11*a* of the enhancement mode MOSFET 80 to the source electrode 10 (the source S in FIG. 28) is supplied to a load.

On the other hand, an instance in which the positive electrode and the negative electrode of the battery are erroneously connected to the semiconductor device 71 according to the second embodiment (reversely connected) is described. When the battery is connected to the semiconductor device 71, positive potential is applied to the source electrode 10 (the source S in FIG. 28) of the enhancement mode MOSFET 80. The enhancement mode MOSFET 80 is connected in the reverse direction and the parasitic diode of the enhancement mode MOSFET 80 is connected in the forward direction. Therefore, it is assumed that even in a state in which a voltage signal that turns ON the enhancement mode MOSFET 80 is not applied to the gate electrodes 8 (OFF state), current flowing from the battery flows from the source electrode 10 (the source S in FIG. 28) of the enhancement mode MOSFET 80, through the parasitic diode, to the junction FET 91. In the junction FET 91 of the semiconductor device 71 according to the second embodiment, the drain electrode 12 is connected to the gate electrode 44. Therefore, negative potential is not applied to the gate electrode 44 of the junction FET 91.

The current that flows from the battery flows from the back electrode 11*b* of the junction FET 91, toward the drain electrode 12 (the drain D in FIG. 28), to the n-type column regions 3. Due to increase of this current, the difference between the potential of the pn junctions between the n-type column regions 3 and the p-type column regions 4 and the potential of the pn junctions between the n-type column regions 3, the n-type drift layer 2*b*, and the p$^-$-type well region 43 increases, a depletion layer spreads, and the current path narrows. Even when the drain electrode 12 and the gate electrode 44 are connected electrically and negative potential cannot be applied to the gate electrode 44, due to the current that flows toward the drain electrode 12 (the drain D in FIG. 28), from the back electrode 11*b*, negative potential is relatively applied to the p-type column regions 4 and the p$^-$-type well region 43 via the pn junctions. As a result, as depicted in FIG. 27, the depletion layer 40 spreads gradually from the pn junctions between the n-type column regions 3 and the p-type column regions 4 and the pn junctions between the n-type column regions 3, the n-type drift layer 2*b*, and the p$^-$-type well region 43. Due to the spreading of the depletion layer 40, the current path of the current flowing in the n-type column regions 3 narrows and the flowing current is suppressed.

Therefore, in an instance in which current flowing in the junction FET 91 becomes at least a certain level, the flowing current is suppressed. As a result, even when the enhancement mode MOSFET 80 is in a conducting state, current flowing in the semiconductor device 71 according to the second embodiment is suppressed and therefore, destruction of the semiconductor device, the control circuit, and the system due to current flowing from the battery may be prevented. Whether the battery is connected in reverse to the semiconductor device 71 according to the second embodiment may be detected by the control circuit similarly to the first embodiment.

Figure 29:
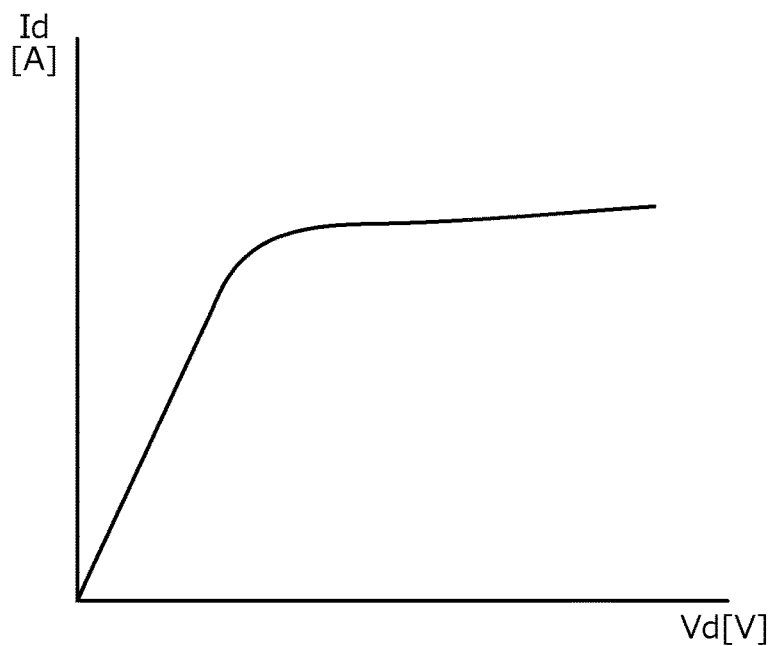
FIG. 29 is a graph depicting output characteristics in an instance in which a battery is connected in reverse to the semiconductor device according to the second embodiment.

FIG. 29 is a graph depicting output characteristics in an instance in which the battery is connected in reverse to the semiconductor device 71 according to the second embodiment. In FIG. 29, a horizontal axis indicates the drain voltage Vd in units of [V]. A vertical axis indicates the drain current Id in units of [A]. In an instance in which the battery is connected in reverse, the source S depicted in FIG. 28 becomes the drain depicted in FIG. 29. As depicted in FIG. 29, in a state in which the drain current Id is small, electric field of the pn junctions is low and spreading of the depletion layer 40 is minimal. Therefore, current paths of the n-type column regions 3 are maintained and the drain current Id flows. Further, when the drain current Id increases, a difference between the potential of the pn junctions between the n-type column regions 3 and the p-type column regions 4 and the potential of the pn junctions between the n-type column regions 3, the n-type drift layer 2b, and the p⁻-type well region 43 occurs, and the depletion layer 40 spreads. As a result, the current paths of the n-type column regions 3 narrow, whereby the drain current Id is suppressed.

In the semiconductor device 71, in an instance in which the battery is connected in reverse, the source electrode 10 of the enhancement mode MOSFET 80 has positive potential and in the forward direction of the built-in parasitic diode, current flows through the back electrode 11a, 11b to the junction FET 91. The drain electrode 12 and the gate electrode 44 of the junction FET 91 are connected (short-circuited) and therefore, negative potential is applied directly to the gate electrode 44 and while current cannot be blocked or restricted, the current flows to the n-type column regions 3, whereby a difference between the potential of the pn junctions between the n-type column regions 3 and the p-type column regions 4 and the potential of the pn junctions between the n-type column regions 3, the n-type drift layer 2b, and the p⁻-type well region 43 occurs, and even when negative potential cannot be applied to the gate electrode 44, negative potential is relatively applied to the p-type column regions 4 and the p⁻-type well region 43 via the pn junctions. As a result, when the battery is connected in reverse, current that flows from the battery, through the source electrode 10 of the enhancement mode MOSFET 80 and to the drain electrode 12 of the junction FET 91 may be suppressed by the junction FET 91.

Figure 34:
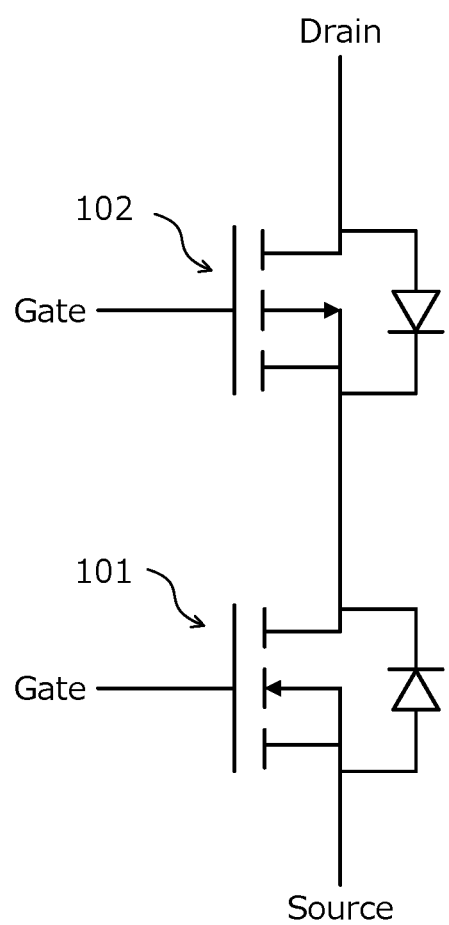
FIG. 34 depicts a first example of a reverse connection preventing circuit of a conventional semiconductor device.
Figure 35:
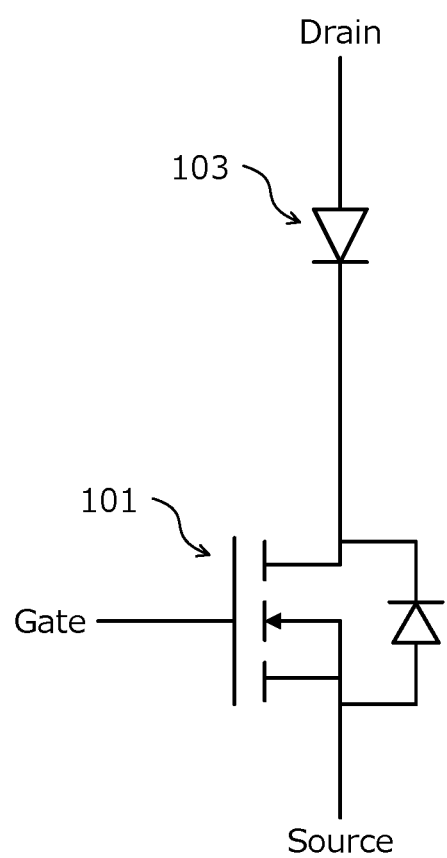
FIG. 35 depicts a second example of the reverse connection preventing circuit of the conventional semiconductor device.

Similarly to the first embodiment, in the second embodiment, the junction FET 91 that has a resistance lower than the resistance of the conventional semiconductor device that uses the p-channel MOSFET 102 depicted in FIG. 34 and lower than the resistance of the conventional semiconductor device that uses the diode 103 depicted in FIG. 35 is used and therefore, an increase of the ON resistance may be suppressed to be low. Furthermore, the enhancement mode MOSFET 80 and the junction FET 91 do not use a Schottky connection and therefore, increases in leak current may be suppressed.

A method of manufacturing the semiconductor device according to the second embodiment, in the junction FET 91, forms the drain electrode 12 and the gate electrode 44 integrated with each other and formation is similarly to the method of manufacturing the semiconductor device according to the first embodiment.

As described above, according to the second embodiment, the drain electrode 12 and the gate electrode 44 integrated with each other. As a result, in an instance in which the battery is connected in reverse, current flows in the junction FET 91 and due to the resulting difference in the potential of the pn junctions between the p-type column regions 4 and the n-type column regions 3 and the potential of the pn junctions between the n-type column regions 3, the n-type drift layer 2b, and the p⁻-type well region 43, the state is the same as when negative potential is applied to the gates. As a result, a depletion layer spreads gradually in the current paths of the n-type column regions 3, whereby large current flowing from the battery may be suppressed. Further, the junction FET 91 having a low resistance similarly to the first embodiment is used and therefore, effects similar to those of the first embodiment are obtained.

Figure 30:
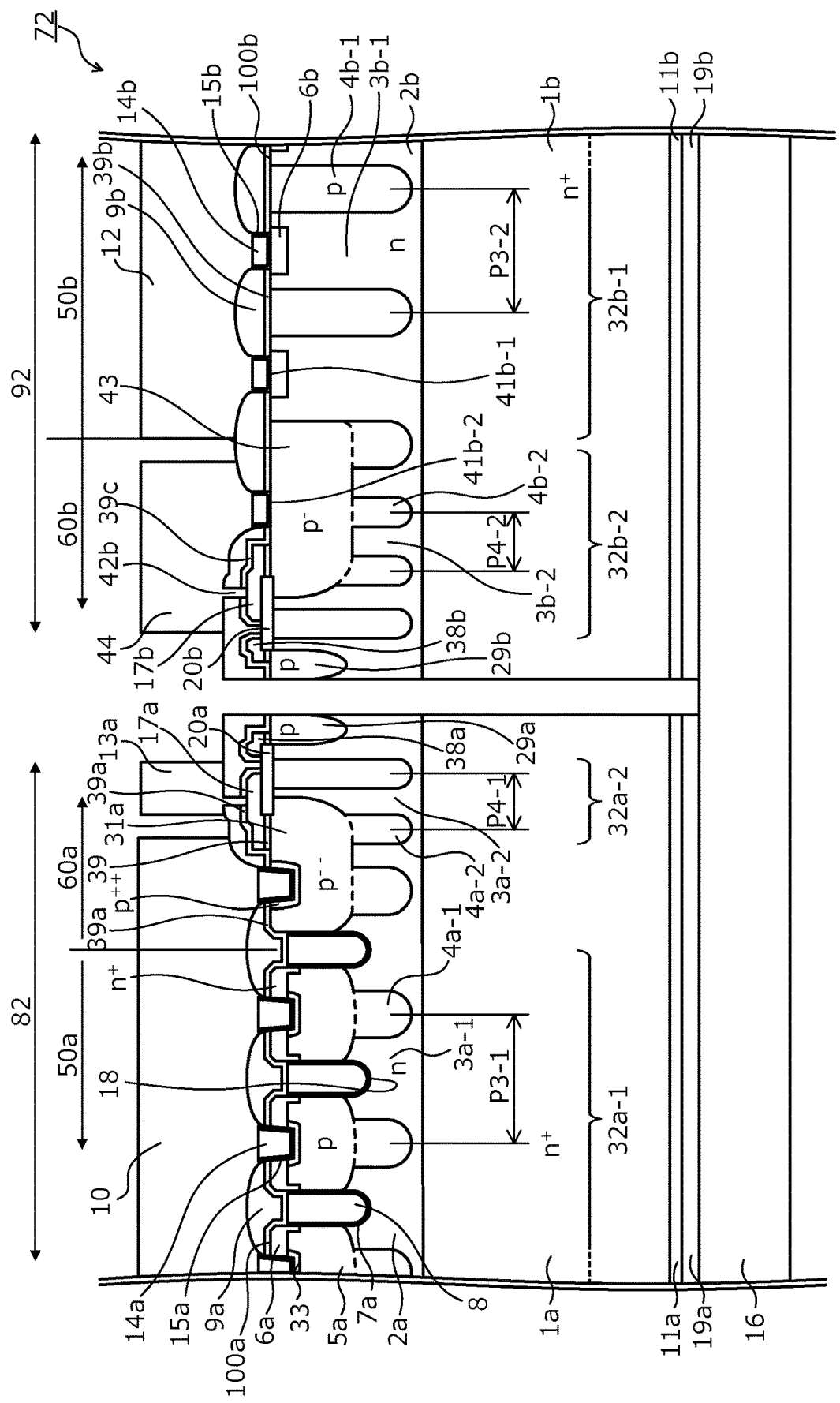
FIG. 30 is a cross-sectional view depicting a structure of a semiconductor device according to a third embodiment.

Next, a structure of a semiconductor device 72 according to a third embodiment is described. FIG. 30 is a cross-sectional view depicting the structure of the semiconductor device 72 according to the third embodiment. As depicted in FIG. 30, the semiconductor device 72 according to the third embodiment differs from the semiconductor device according to the first embodiment in that in an enhancement mode MOSFET 82, parallel pn regions 32a-1, 32a-2 are provided, and in a junction FET 92, a parallel pn region 32b-2 is further provided in the edge termination region 60b.

In the parallel pn region 32a-1 provided in the enhancement mode MOSFET 82, n-type column regions 3a-1 and p-type column regions (first columns) 4a-1 are disposed to repeatedly alternate with one another in a direction parallel to the surface 100a of the n-type drift layer 2a. The p-type column regions 4a-1 are provided so as to be in contact with surfaces of the p-type base regions 5a in the active region 50a. Portions of the n-type drift layer 2a between adjacent p-type column regions 4a-1 of the p-type column regions 4a-1 are the n-type column regions 3a-1.

In the parallel pn region 32a-2 provided in the enhancement mode MOSFET 82, in an outer periphery of the edge termination region 60a, the n-type column regions 3a-2 and p-type column regions (second columns) 4a-2 are disposed to repeatedly alternate with one another in a direction parallel to the surface 100a of the n-type drift layer 2a. The p-type column regions 4a-2 may be in contact with the bottom of the p⁻⁻-type RESURF region 31a. Portions of the n-type drift layer 2a between adjacent p-type column regions 4a-2 of the p-type column regions 4a-2 form the n-type column regions 3a-2. One of the p-type column regions 4a-1 is provided so as to be in contact with the bottom of the p⁻⁻-type RESURF region 31a near the active region 50a.

The p-type column regions 4a-1 and the n-type column regions 3a-1 of the parallel pn region 32a-1, and the p-type column regions 4a-2 and the n-type column regions 3a-2 of the parallel pn region 32a-2 are provided having a stripe shape in a plan view thereof.

Further, an interval P3-1 (repeat pitch) between centers of the p-type column regions 4a-1 adjacent to each other of the parallel pn region 32a-1 may be wider than an interval P4-1 (repeat pitch) between centers of the p-type column regions 4a-2 adjacent to each other of the parallel pn region 32a-2.

In the active region 50b of the junction FET 92, similarly to the junction FET 90 depicted in FIG. 1, the parallel pn region 32b-1 in which the n-type column regions 3b-1 and the p-type column regions 4b-1 repeatedly alternate with one another is provided.

In the parallel pn region 32b-2 provided in the edge termination region 60b of the junction FET 92, n-type column regions 3b-2 and p-type column regions (second fifth-semiconductor-layer) 4b-2 are disposed to repeatedly alternate with one another in a direction parallel to the surface 100b of the n-type drift layer 2b. The p-type column regions 4b-2 may be in contact with the bottom of the p⁻-type well region 43. Portions of the n-type drift layer 2b between adjacent p-type column regions 4b-2 of the p-type column regions 4b-2 form the n-type column regions 3b-2. One of the p-type column regions 4b-1 is provided so as to be in contact with the bottom of the p⁻-type well region 43 near the active region 50b.

The p-type column regions 4b-1 and the n-type column regions 3b-1 of the parallel pn region 32b-1, and the p-type column regions 4b-2 and the n-type column regions 3b-2 of the parallel pn region 32b-2 are provided having a stripe shape in a plan view thereof.

Further, an interval P3-2 (repeat pitch) between centers of the p-type column regions 4b-1 adjacent to each other of the parallel pn region 32b-1 may be wider than an interval P4-2 (repeat pitch) between centers of the p-type column regions 4b-2 adjacent to each other of the parallel pn region 32b-2.

In the enhancement mode MOSFET 82 depicted in FIG. 30, while the direction in which the n-type column regions 3a-1 and the p-type column regions 4a-1 of the parallel pn region 32a-1 repeatedly alternate with one another is a same direction (parallel to) as the direction in which the trenches 18 are arranged, the arrangement direction of the trenches 18 and the direction in which the n-type column regions 3a-1 and the p-type column regions 4a-1 repeatedly alternate with one another may be orthogonal to each other.

In the third embodiment, the enhancement mode MOSFET 82 has a super junction (SJ) structure. As a result, the impurity concentration of the n-type drift layer 2a may be increased and therefore, the ON resistance may be reduced. Further, in an outer periphery of the junction FET 92, the parallel pn region 32b-2 is provided in the edge termination region 60b, whereby the ON resistance may be reduced. Similarly to the first embodiment, the junction FET 92 having a resistance lower than that of the conventional semiconductor device that uses the p-channel MOSFET 102 depicted in FIG. 34 and lower than that of the conventional semiconductor device that uses the diode 103 depicted in FIG. 35 is used and therefore, increases in the ON resistance may be suppressed to be low. Furthermore, the enhancement mode MOSFET 82 and the junction FET 92 do not use a Schottky connection and therefore, increases in leak current may be suppressed.

As described above, according to the third embodiment, the enhancement mode MOSFET has a SJ structure. As a result, even when the impurity concentration of the n-type drift layer is increased, the ON resistance may be reduced without the breakdown voltage decreasing. Further, similarly to the first embodiment, the junction FET 92 having a resistance lower than that of the conventional semiconductor device that uses the p-channel MOSFET 102 depicted in FIG. 34 and lower than that of the conventional semiconductor device that uses the diode 103 depicted in FIG. 35 is used and therefore, effects similar to those of the first embodiment are obtained.

Figure 31:
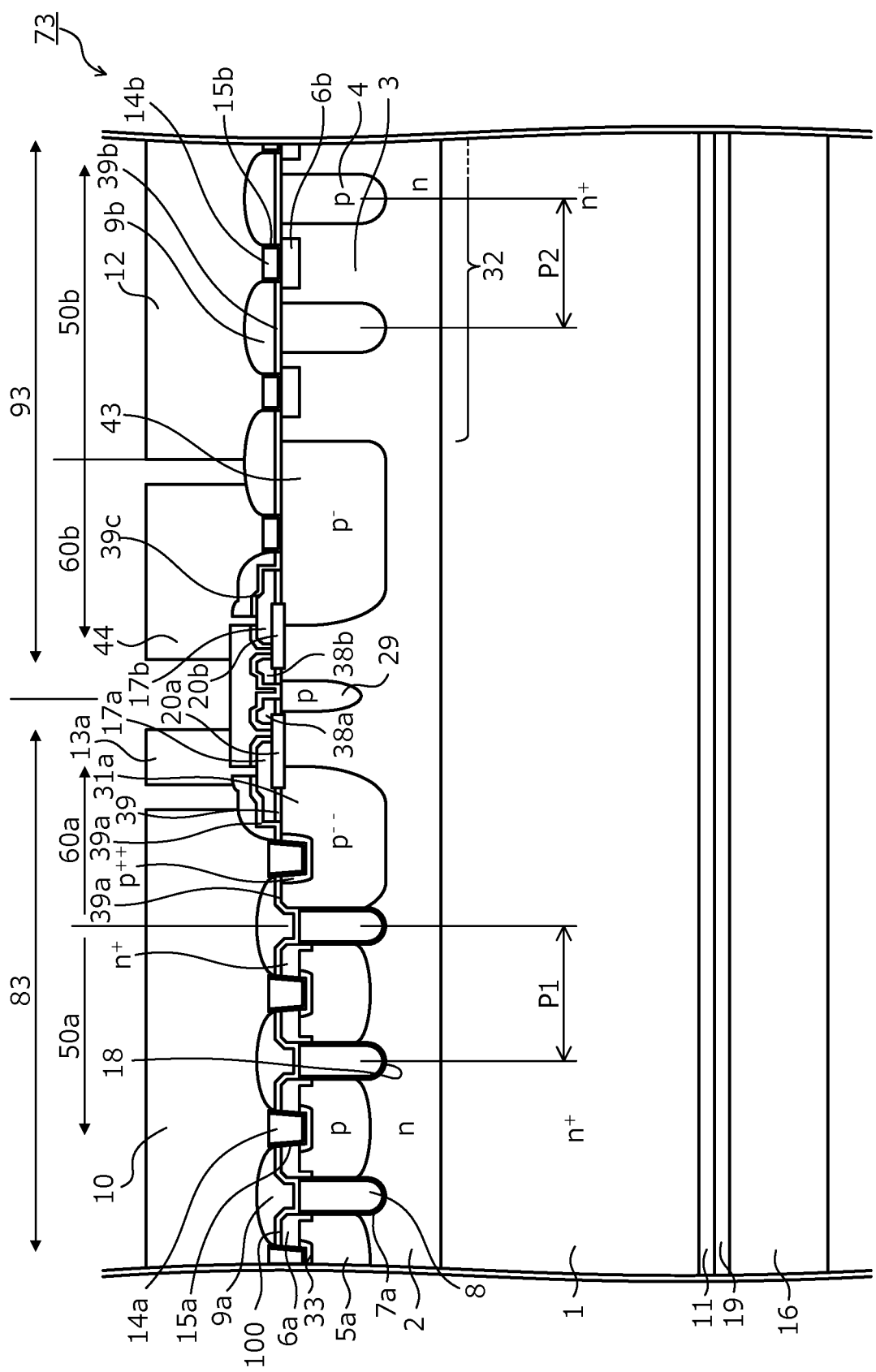
FIG. 31 is a cross-sectional view depicting a structure of a semiconductor device according to a fourth embodiment.
Figure 32:
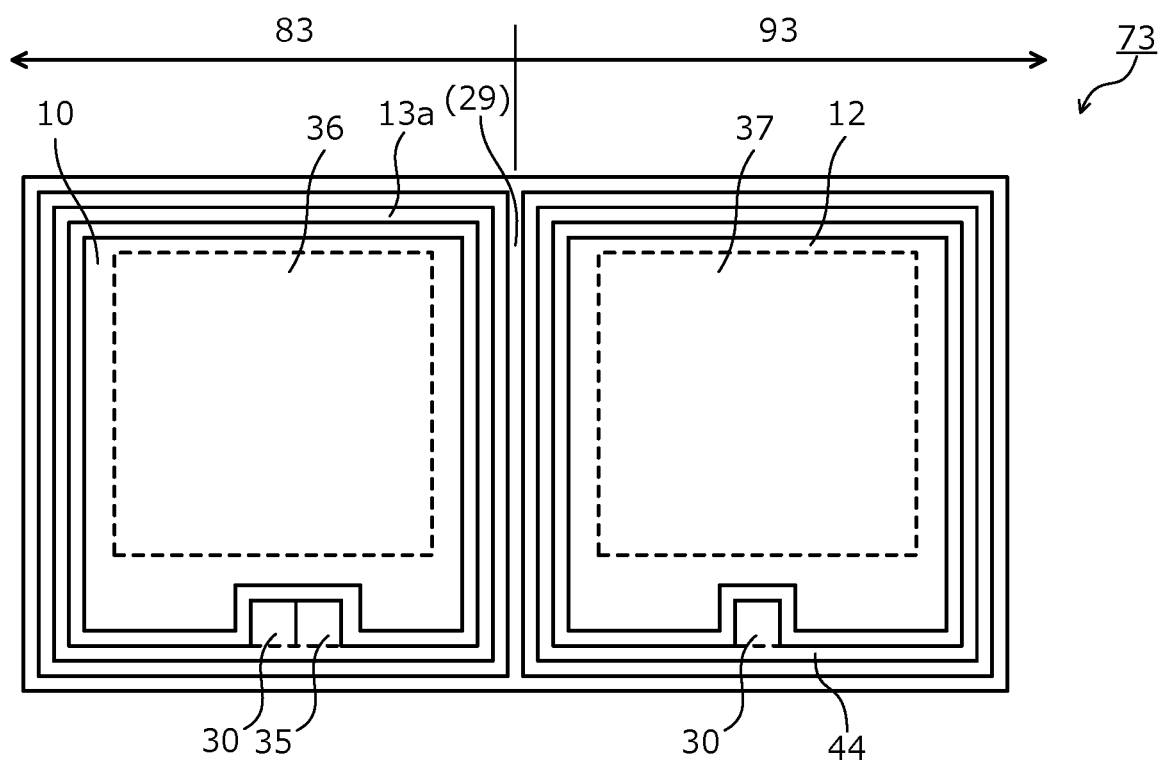
FIG. 32 is a plan view depicting the structure of the semiconductor device according to the fourth embodiment.

Next, a structure of a semiconductor device according to a fourth embodiment is described. FIG. 31 is a cross-sectional view depicting a structure of a semiconductor device 73 according to the fourth embodiment. FIG. 32 is a plan view depicting the structure of the semiconductor device 73 according to the fourth embodiment. As depicted in FIGS. 31 and 32, the semiconductor device 73 according to the fourth embodiment differs from the semiconductor device according to the first embodiment in that the enhancement mode MOSFET 80 and the junction FET 90 depicted in FIG. 1 are formed on a single semiconductor substrate.

The semiconductor device 73 depicted in FIG. 31 has an enhancement mode MOSFET region 83 and a junction FET region 93 on a single n$^+$-type semiconductor substrate 1 on which an n-type drift layer 2 and a back electrode 11 are provided. Further, the enhancement mode MOSFET region 83 and the junction FET region 93 have a common p-type channel stopper (second semiconductor layer) 29. A border between the enhancement mode MOSFET region 83 and the junction FET region 93 is assumed to be between the field plate 38a and the field plate 38b provided on an upper portion of the p-type channel stopper 29. The semiconductor device 73 is assumed to have the p-type channel stopper 29, however, an n-type channel stopper may be provided. In the enhancement mode MOSFET region 83, the cell pitch is assumed to be the interval P1 from the center of one of the trenches 18 to the center of one of the trenches 18 adjacent thereto.

In the junction FET region 93, the cell pitch is assumed to be the interval P2 of the centers of the p-type column regions 4 that are adjacent to each other across one of the n-type column regions 3. The cell pitch (the interval P2) of the junction FET region 93 may be narrower than the cell pitch (the interval P1) of the enhancement mode MOSFET region 83. Further, the cell pitch (the interval P2) of the junction FET region 93 may be an interval equal to the cell pitch (the interval P1) of the enhancement mode MOSFET region 83.

Further, as depicted in FIG. 32, in the enhancement mode MOSFET region 83, a protective film (not depicted) is provided on the source electrode 10. The protective film is, for example, a polyimide, etc. In the protective film provided on the source electrode 10, an opening that exposes the source electrode 10 is provided. The opening forms a source electrode pad 36.

In the junction FET region 93, a protective film (not depicted) is provided on the drain electrode 12. The protective film is, for example, a polyimide, etc. In the protective film provided on the drain electrode 12, an opening that exposes the drain electrode 12 is provided. The opening forms a drain electrode pad 37.

In the enhancement mode MOSFET region 83, a high-function portion 35 such as, for example, a current sensing portion, a temperature detecting portion, etc. may be provided. In the junction FET region 93, the high-function portion 35 may be omitted. In an instance in which the high-function portion 35 includes a current sensing portion, a structure similar to that of the active region 50a of the enhancement mode MOSFET region 83 is provided and by an area ratio of the active region 50a and the current sensing portion, the current flowing in the enhancement mode MOSFET region 83 may be obtained. This current value is detected by a control circuit (not depicted) provided separately from the semiconductor device 73. For example, in an instance in which a current value at least equal to the rated current is detected, a control signal is transmitted from the control circuit to the gate electrodes 8 of the enhancement mode MOSFET region 83, and the semiconductor device 73 or another semiconductor device element (not depicted) connected to the semiconductor device 73 may be protected from overcurrent.

In this manner, in the fourth embodiment, the enhancement mode MOSFET region 83 that corresponds to the enhancement mode MOSFET 80 of the first embodiment and the junction FET region 93 that corresponds to the junction FET 90 of the first embodiment are formed on a single semiconductor chip. Therefore, the n$^+$-type semiconductor substrate 1, the n-type drift layer 2, etc. may be formed concurrently, thereby enabling manufacturing cost to be reduced. Further, heat generated by the enhancement mode MOSFET region 83 may be dissipated in the junction FET region 93 and therefore, the heat dissipation area may be increased. As in the first to the third embodiments, in an instance in which the enhancement mode MOSFET and the junction FET are separate semiconductor chips, the enhancement mode MOSFETs 80, 82 and the junction FETs 90, 91, 92 are separated by a distance therebetween, thereby requiring mounting to the frame electrode 16. In the fourth embodiment, a single semiconductor chip is used, whereby separation by a distance and mounting to the frame electrode 16 become unnecessary, thereby enabling reduction of the mounting area. Further, chip-on-chip in which another semiconductor chip is mounted on the upper surface of the semiconductor device 73 is possible. Furthermore, the gate electrode 44 and the drain electrode 12 of the junction FET region 93 may be provided so as to be connected to each other (short-circuited). As a result, effects similar to those of the second embodiment may be obtained.

As described above, according to the fourth embodiment, the enhancement mode MOSFET and the junction FET are formed as a single chip. Therefore, the heat dissipation area may be increased and the mounting area may be decreased. Further, similarly to the first embodiment, the junction FET having low resistance is used and therefore, effects similar to those of the first embodiment are obtained.

In the fourth embodiment, while the enhancement mode MOSFET 80 and the junction FET 90 of the first embodiment are on a single semiconductor chip, any one of the enhancement mode MOSFETs 80, 82 and any one of the junction FETs 90, 91, 92 of the first to third embodiments may be combined on a single semiconductor chip.

Figure 33:
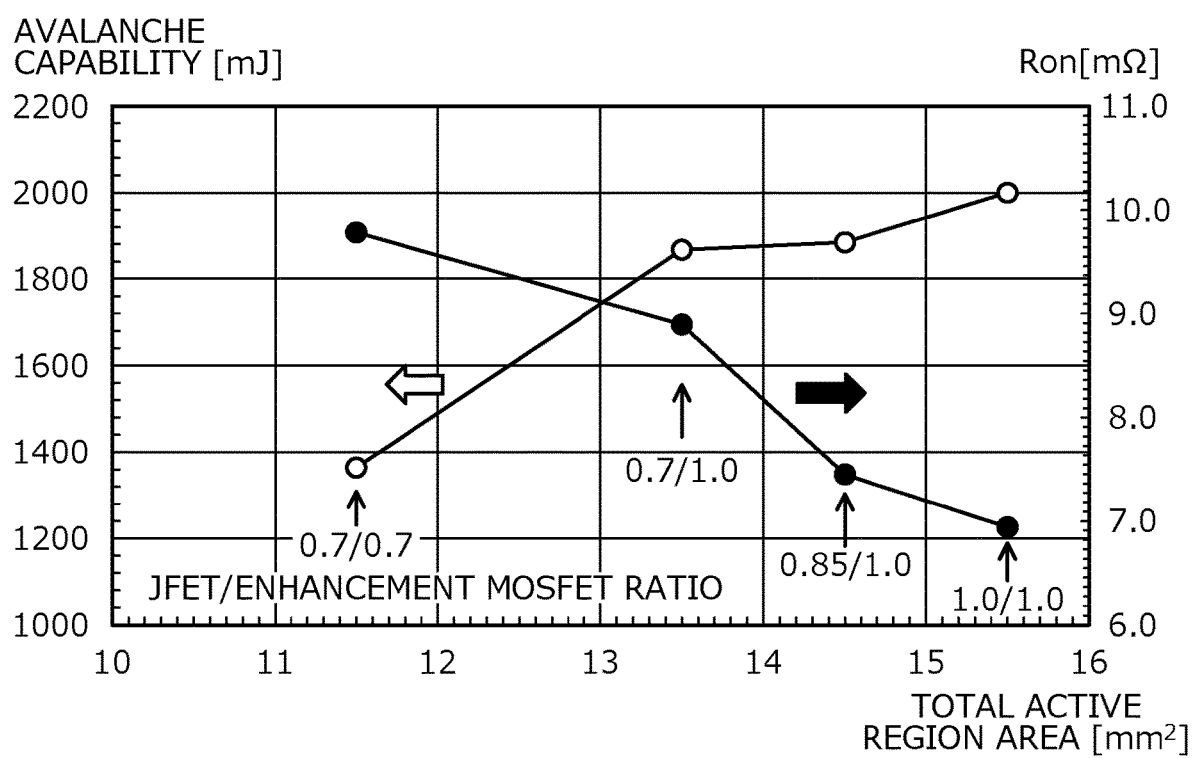
FIG. 33 is a graph depicting correlation of avalanche capability and, Ron and total active region area under a combination condition of active region areas of a junction FET and an enhancement mode MOSFET.

FIG. 33 is a graph depicting correlation of avalanche capability and, Ron and total active region area under a combination condition of active region areas of the junction FET and the enhancement mode MOSFET. In FIG. 33, a horizontal axis indicates the total active region area in units of mm$^2$, a left-vertical axis indicates avalanche capability in units of mJ, and a right-vertical axis indicates Ron (ON resistance) in units of mΩ. In FIG. 33, a curve of white circles indicates avalanche capability, and a curve of black circles indicates Ron.

Further, in FIG. 33, not only is the total active region area varied but an area ratio of the active region area of the junction FET 90 to the active region area of the enhancement mode MOSFET 80 (the active region area of the junction FET 90/the active region area of the enhancement mode MOSFET 80) is varied. For example, in FIG. 33, a point indicating an area ratio 1.0/1.0 indicates that the active region area of the junction FET 90 and the active region area of the enhancement mode MOSFET 80 have equal areas. Further, a point indicating an area ratio 0.7/1.0 indicates that the active region area of the junction FET 90 is 0.7 times of the point of the area ratio 1.0/1.0, and the active region area of the enhancement mode MOSFET 80 is 1.0 times of the point of the area ratio 1.0/1.0. Further, a point of area ratio 0.7/0.7 indicates that the active region area of the junction FET 90 is 0.7 times of the point of the area ratio 1.0/1.0, and the active region area of the enhancement mode MOSFET 80 is 0.7 times of the point of the area ratio 1.0/1.0.

Here, the total active region area is a sum of the active region area of the enhancement mode MOSFET 80 and the active region area of the junction FET 90. Further, the active region area of the enhancement mode MOSFET 80 is the area of the active region 50$a$ and, in particular, is the area of a region further on an inner side (side opposite to the p-type channel stopper 29$a$) than is the center of one of the trenches 18 that one of the n$^+$-type source regions 6$a$ contacts. Further, the active region area of the junction FET 90 is the area of the active region 50$b$ and, in particular, is the area of a region further on an inner side (side opposite to the p-type channel stopper 29$b$) than is an end of the drain electrode 12.

In this manner, in the embodiments of the present invention, a combination condition of the active region areas of the enhancement mode MOSFET 80 and the junction FET 90 is changed, whereby selection of necessary characteristics (Ron, avalanche capability) becomes possible.

Further, as depicted in FIG. 33, in comparing the point of the area ratio 1.0/1.0 and the point of the area ratio 0.7/0.7, in an instance in which the area ratios are equal, by increasing the total active region area, Ron may be reduced and the avalanche capability may be increased. Further, in comparing the point of the area ratio 1.0/1.0, the point of the area ratio 0.85/1.0, and the point of the area ratio 0.7/1.0, when the ratio of the active region area of the junction FET 90 decreases, Ron increases and the avalanche capability decreases. Therefore, in the embodiments of the present invention, the ratio of the active region area of the junction FET 90 and the active region area of the enhancement mode MOSFET 80 may be preferably within 10% (the active region area of the junction FET 90/the active region area of the enhancement mode MOSFET 80≤0.1).

In the foregoing, while an instance in which a silicon (Si) substrate is used is described as an example, without limitation hereto, various modifications are possible such as the type of semiconductor (for example, silicon carbide (SiC), etc.), surface orientation of a substrate main surface, etc. Further, in the embodiments of the present invention, while an enhancement mode MOSFET having trench gates is described as an example, without limitation hereto, application is possible to a semiconductor device variously configured using a semiconductor device such as an IGBT, an enhancement mode MOSFET having planar gates, etc. Further, in the present embodiments, while the first conductivity type is assumed to be an n-type and the second conductivity type is assumed to be a p-type, the present invention is similarly implemented when the first conductivity type is a p-type and the second conductivity type is an n-type.

According to the invention described above, the drain electrode of the enhancement mode MOSFET and the drain electrode of the junction FET are connected, the source electrode of the enhancement mode MOSFET is assumed as the source electrode of the semiconductor device, and the source electrode of the junction FET is assumed as the drain electrode of the semiconductor device. As a result, in an instance in which the battery is connected properly, the parasitic diode in the enhancement mode MOSFET blocks large current and the junction FET does not perform blocking. On the other hand, in an instance in which the battery is connected in reverse, while large current cannot be blocked by the enhancement mode MOSFET, a predetermined voltage is applied to the gate electrodes of the junction FET, whereby large current may be blocked. Further, the junction FET that has a resistance lower than the resistance of the conventional semiconductor device that uses the p-channel MOSFET 102 depicted in FIG. 34 and lower than the resistance of the conventional semiconductor device that uses the diode 103 depicted in FIG. 35 is used and therefore, an increase of the ON resistance may be suppressed to be low. Furthermore, in the enhancement mode MOSFET and the junction FET, no Schottky connection is used and therefore, increases in leak current may be suppressed.

According to the method of manufacturing the semiconductor device according to the present invention, an effect is achieved in that when the battery is connected in reverse, destruction by the flow of large current is prevented and increases in the ON resistance may be suppressed.

As described above, the semiconductor device according to the present invention is useful for high-voltage semiconductor devices used in power converting equipment, power source devices such as in various types of industrial machines, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
an enhancement mode MOSFET (metal-oxide-semiconductor field effect transistor) having:
   a first semiconductor substrate of a first conductivity type, having a first surface and a second surface opposite to each other;
   a first first-semiconductor-layer of the first conductivity type, provided on the first surface of the first semiconductor substrate and having an impurity concentration lower than an impurity concentration of the first semiconductor substrate;
   the first semiconductor substrate and the first first-semiconductor-layer having a first active region and a first termination region surrounding the first active region,
   the first active region having:
      a first second-semiconductor-layer of a second conductivity type, selectively provided in the first first-semiconductor-layer at a surface thereof;
      a plurality of first first-semiconductor-regions of the first conductivity type, provided in the first second-semiconductor-layer at a surface thereof;
      a plurality of trenches each in contact with a respective one of the first first-semiconductor-regions, and penetrating through the first second-semiconductor-layer so that a bottom of each of the trenches is positioned further from the first surface in a depth direction than the first second-semiconductor-layer;
      a plurality of first gate-insulating-films each provided in a respective one of the trenches;
      a plurality of first gate electrodes each provided in a respective one of the trenches via a respective one of the first gate-insulating-films;
      a first interlayer-insulating-film covering upper surfaces of the first first-semiconductor-regions and the first gate electrodes, and being free of direct contact with the first second-semiconductor-layer;
      a first first-electrode provided on upper surfaces of the first first-semiconductor-regions and the first interlayer-insulating-film; and
      a first second-electrode provided in an entire area of the second surface of the first semiconductor substrate;
a junction FET having:
   a second semiconductor substrate of the first conductivity type, having a third surface and a fourth surface opposite to each other;
   a second first-semiconductor-layer of the first conductivity type, provided on the third surface of the second semiconductor substrate and having an impurity concentration lower than an impurity concentration of the second semiconductor substrate;
   the second semiconductor substrate and the second first-semiconductor-layer having a second active region and a second termination region surrounding the second active region,
   the second active region having:
      a plurality of second first-semiconductor-regions of the first conductivity type, each selectively provided in the second first-semiconductor-layer at a surface thereof;
      a plurality of second second-semiconductor-layers of the second conductivity type, each selectively provided in the second first-semiconductor-layer at the surface thereof;
      a second interlayer insulating film covering upper surfaces of the second first-semiconductor-layer and the second second-semiconductor-layers, and being free of direct contact with at least a portion of an upper surface of each of the second first-semiconductor-regions; and
      a second first-electrode provided on upper surfaces of the second interlayer insulating film and the second first-semiconductor-regions;
   the second termination region having a second gate electrode electrically connected to the second second-semiconductor-layers; and
   a second second-electrode provided in an entire area of the fourth surface of the second semiconductor substrate, wherein
   the first second-electrode is electrically connected to the second second-electrode.

2. The semiconductor device according to claim 1, wherein
the second active region has a first parallel pn structure in which the second second-semiconductor-layers and a plurality of pieces of the second first-semiconductor-layer are disposed to repeatedly alternate with one another in a direction parallel to the third surface of the second semiconductor substrate, and
the second first-semiconductor-regions are each provided in a surface layer of each piece of the second first-semiconductor-layer of the first parallel pn structure.

3. The semiconductor device according to claim 2, wherein
each piece of the second first-semiconductor-layer and each of the second second-semiconductor-layers of the first parallel pn structure have a stripe shape in a plan view of the semiconductor device.

4. The semiconductor device according to claim 1, wherein
the second termination region further includes:
   a second third-semiconductor-layer of the second conductivity type, provided in the second termination region, spanning from an outermost peripheral portion of the second active region, and
   a second fourth-semiconductor-layer of the second conductivity type, provided in the second first-semiconductor-layer at a surface thereof, separate from the second third-semiconductor-layer at a side opposite to a side in which the second active region is disposed,
the second third-semiconductor-layer and the second fourth-semiconductor-layer are provided in a ring-shape in a plan view of the semiconductor device, and
the second third-semiconductor-layer is electrically connected to the second second-semiconductor-layers.

5. The semiconductor device according to claim 4, wherein
the second gate electrode is provided in a ring-shape in the plan view, on the second interlayer insulating film provided in the second termination region, the second gate electrode being electrically connected to the second third-semiconductor-layer.

6. The semiconductor device according to claim 1, wherein
the second termination region further includes
   a plurality of second fifth-semiconductor-layers of the second conductivity type, selectively provided in the second first-semiconductor-layer, and
   the second termination region has a second parallel pn structure in which the second fifth-semiconductorlayers and a plurality of pieces of the second first-semiconductor-layer are disposed to repeatedly alternate with one another in a direction parallel to the third surface of the second semiconductor substrate.

7. The semiconductor device according to claim 1, wherein
one of the trenches is disposed at a border between the first active region and the first termination region, the one trench having first and second side surfaces opposite to each other, the first side surface being located in the first termination region,
the first termination region further includes:
a first third-semiconductor-layer of the second conductivity type, provided in the first first-semiconductor-layer, the first third-semiconductor-layer being in contact with the first side surface of the one trench provided at the border, and
a first fourth-semiconductor-layer of the second conductivity type, provided in the first first-semiconductor-layer at the surface thereof, separate from the first third-semiconductor-layer at a side opposite to a side in which the first active region is disposed, and
the first third-semiconductor-layer is electrically connected to the first first-electrode.

8. The semiconductor device according to claim 1, wherein
the first active region further includes a plurality of first columns of the second conductivity type, selectively provided in the first first-semiconductor-layer at the surface thereof, the first second-semiconductor-layer being disposed at an upper surface of each of the first columns,
the first active region has a third parallel pn structure in which a plurality of pieces of the first first-semiconductor-layer and the first columns are disposed to repeatedly alternate with one another in a direction parallel to the first surface of the first semiconductor substrate,
the first termination region further includes a plurality of second columns of the second conductivity type, selectively provided in the first first-semiconductor-layer at the surface thereof, and
the first termination region has a fourth parallel pn structure in which a plurality of pieces of the first first-semiconductor-layer and the second columns are disposed to repeatedly alternate with one another in a direction parallel to the first surface of the first semiconductor substrate.

9. The semiconductor device according to claim 1, further comprising:
a first insulating film provided between the first interlayer-insulating-film and the first gate electrodes, and between the first interlayer-insulating-film and the first first-semiconductor-regions; and
a second insulating film provided between the second interlayer insulating film and the second first-semiconductor-layer, and between the second interlayer insulating film and the second second-semiconductor-layers.

10. The semiconductor device according to claim 1, wherein
the second gate electrode is electrically connected to the second first-electrode.

11. The semiconductor device according to claim 1, wherein
the enhancement mode MOSFET includes a high-function structure that detects current and voltage to protect the semiconductor device against overvoltage.

12. The semiconductor device according to claim 1, wherein
an area size of the second active region of the junction FET is 10% or less of an area size of the first active region of the enhancement mode MOSFET.

13. A semiconductor device, comprising:
a semiconductor substrate of a first conductivity type, having a first surface and a second surface opposite to each other;
a first semiconductor layer of the first conductivity type, provided on the first surface of the semiconductor substrate and having an impurity concentration lower than an impurity concentration of the semiconductor substrate;
the semiconductor substrate and the first semiconductor layer having an enhancement mode MOSFET region and a junction FET region in contact with the enhancement mode MOSFET region,
the enhancement mode MOSFET region having:
a first active region and a first termination region surrounding the first active region,
the first active region having:
a first second-semiconductor-layer of a second conductivity type, selectively provided in the first semiconductor layer at a surface thereof;
a plurality of first first-semiconductor-regions of the first conductivity type, each provided in the first second-semiconductor-layer at a surface thereof;
a plurality of trenches each in contact with a respective one of the first first-semiconductor-regions, and penetrating through the first second-semiconductor-layer so that a bottom of each of the trenches is positioned below the first second-semiconductor-layer in a depth direction of first semiconductor layer;
a plurality of first gate-insulating-films each provided in a respective one of the trenches;
a plurality of first gate electrodes each provided in a respective one of the trenches via a respective one of the first gate-insulating-films;
a first interlayer-insulating-film covering upper surfaces of the first first-semiconductor-regions and the first gate electrodes, and being free of direct contact with the first second-semiconductor-layer; and
a first first-electrode provided on upper surfaces of the first first-semiconductor-regions and the first interlayer-insulating-film;
the junction FET region having:
a second active region and a second termination region surrounding the second active region,
the second active region having:
a plurality of second first-semiconductor-regions of the first conductivity type, selectively provided in the first semiconductor layer at the surface thereof;
a plurality of second second-semiconductor-layers of the second conductivity type, each selectively provided in the first semiconductor layer at the surface thereof;
a second interlayer insulating film covering upper surfaces of the first semiconductor layer and the second second-semiconductor-layers, and being free of direct contact with at least a portion of an upper surface of each of the second first-semiconductor-regions;
a second first-electrode provided on upper surfaces of the second interlayer insulating film and the second first-semiconductor-regions;
the second termination region having:
a second gate electrode electrically connected to one of the second second-semiconductor-layers;
a back electrode provided in an entire area of the second surface of the semiconductor substrate; and
a second semiconductor layer of the second conductivity type, provided at a border between the enhancement mode MOSFET region and the junction FET region of the first semiconductor layer.

14. The semiconductor device according to claim 13, wherein
the second active region has a first parallel pn structure in which the second second-semiconductor-layers and a plurality of pieces of the first semiconductor layer are disposed to repeatedly alternate with one another in a direction parallel to the first surface of the semiconductor substrate, and
the second first-semiconductor-regions are each provided in a surface layer of each piece of the first semiconductor layer of the first parallel pn structure.

15. The semiconductor device according to claim 14, wherein
each piece of the first semiconductor layer and each of the second second-semiconductor-layers of the first parallel pn structure have a stripe shape in a plan view of the semiconductor device.

16. The semiconductor device according to claim 13, wherein
the second termination region of the junction FET region further includes:
a second third-semiconductor-layer of the second conductivity type, provided in the second termination region, spanning from an outermost peripheral portion of the second active region, and
a second fourth-semiconductor-layer of the second conductivity type, provided in the first semiconductor layer at the surface thereof, separate from the second third-semiconductor-layer at a side opposite to a side in which the second active region is disposed,
the second third-semiconductor-layer and the second fourth-semiconductor-layer are provided in a ring-shape in the plan view, and
the second third-semiconductor-layer is electrically connected to the second second-semiconductor-layers.

17. The semiconductor device according to claim 16, wherein
the second gate electrode is provided in a ring-shape in the plan view, on the second interlayer insulating film provided in second termination region, the second gate electrode being electrically connected to the second third-semiconductor-layer.

18. The semiconductor device according to claim 13, wherein
the second termination region further includes a plurality of second fifth-semiconductor-layers of the second conductivity type, each selectively provided in the first semiconductor layer, and
the second termination region has a second parallel pn structure in which the second fifth-semiconductor-layers and a plurality of pieces of the first semiconductor layer are disposed to repeatedly alternate with one another in a direction parallel to the first surface of the semiconductor substrate.

19. The semiconductor device according to claim 13, wherein
one of the trenches is disposed at a border between the first active region and the first termination region, the one trench having first and second side surfaces opposite to each other, the first side surface being located in the first termination region,
the first termination region further includes:
a first third-semiconductor-layer of the second conductivity type, provided in the first semiconductor layer, the first third-semiconductor-layer being in contact with the first side surface of the one trench provided at the border, and
a first fourth-semiconductor-layer of the second conductivity type, provided in the first semiconductor layer at the surface thereof, separate from the first third-semiconductor-layer at a side opposite to a side in which the first active region is provided, and
the first third-semiconductor-layer is electrically connected to the first first-electrode.

20. The semiconductor device according to claim 13, wherein
the first active region further includes a plurality of first columns of the second conductivity type, selectively provided in the first semiconductor layer at a surface thereof, the first second-semiconductor-layer being disposed at upper surfaces of the first columns,
the first active region has a third parallel pn structure in which a plurality of pieces of the first semiconductor layer and the first columns are disposed to repeatedly alternate with one another in a direction parallel to the first surface of the semiconductor substrate, and
the first termination region further includes a plurality of second columns of the second conductivity type, selectively provided in the first semiconductor layer at the surface thereof, and
the first termination region has a fourth parallel pn structure in which a plurality of pieces of the first semiconductor layer and the second columns are disposed to repeatedly alternate with each other in a direction parallel to the first surface of the semiconductor substrate.

21. The semiconductor device according to claim 13, further comprising:
a first insulating film provided between the first interlayer-insulating-film and the first gate electrodes, and between the first interlayer-insulating-film and the first first-semiconductor-regions;
a second insulating film provided between the second interlayer insulating film and the first semiconductor layer, and between the second interlayer insulating film and the second second-semiconductor-layers.

22. The semiconductor device according to claim 13, wherein
the second gate electrode is electrically connected to the second first-electrode.

23. The semiconductor device according to claim 13, wherein
the enhancement mode MOSFET region includes a high-function structure that detects current and voltage to protect the semiconductor device against overvoltage.

24. The semiconductor device according to claim 13, wherein
an area size of the second active region of the junction FET is 10% or less of an area size of the first active region of the enhancement mode MOSFET.

* * * * *